US012699138B2

(12) United States Patent
Gope et al.

(10) Patent No.: US 12,699,138 B2
(45) Date of Patent: Aug. 4, 2026

(54) ANOMALOUS BATTERY NODE DETECTION AND MITIGATION SYSTEM

(71) Applicant: Element Energy, Inc., Menlo Park, CA (US)

(72) Inventors: Chandan Gope, Cupertino, CA (US); Kevin Yiwei Zhao, Cupertino, CA (US); William Joseph Judge, Redwood City, CA (US); Yoosok Saw, Mountain View, CA (US)

(73) Assignee: Element Energy Inc., Menlo Park, CA (US)

( * ) Notice: Subject to any disclaimer, the term of this patent is extended or adjusted under 35 U.S.C. 154(b) by 773 days.

(21) Appl. No.: 18/188,040

(22) Filed: Mar. 22, 2023

(65) Prior Publication Data

US 2024/0319277 A1 Sep. 26, 2024

(51) Int. Cl.
G01R 31/367 (2019.01)
G01R 31/382 (2019.01)
H02J 7/94 (2026.01)

(52) U.S. Cl.
CPC ......... G01R 31/367 (2019.01); G01R 31/382 (2019.01); H02J 7/94 (2026.01)

(58) Field of Classification Search
CPC ............................ G01R 31/367; G01R 31/382
See application file for complete search history.

(56) References Cited

U.S. PATENT DOCUMENTS

| | | | |
|---|---|---|---|
| 8,719,195 B2 | 5/2014 | Frisch et al. | |
| 11,131,713 B2 | 9/2021 | Hooshmand et al. | |
| 2010/0017155 A1 | 1/2010 | Nareid | |
| 2019/0392320 A1 | 12/2019 | Kim | |
| 2022/0057350 A1* | 2/2022 | Fasching | H01M 50/204 |
| 2022/0057455 A1* | 2/2022 | Fasching | G01R 31/396 |
| 2023/0280411 A1* | 9/2023 | Masse | G01R 31/396 |
| | | | 702/63 |
| 2024/0201275 A1* | 6/2024 | Shao | G01R 31/367 |

* cited by examiner

*Primary Examiner* — Ricky Go
(74) *Attorney, Agent, or Firm* — Polygon IP, LLP

(57) ABSTRACT

Battery system diagnostic data may be generated at battery node controllers in a battery system. A battery node controller may selectively couple a power bus with a battery node including one or more battery cells. An unsupervised machine learning model may be trained based on the battery system diagnostic data. Outlier values may be determined by applying the machine learning model to the battery node diagnostic data. A battery node may be identified as anomalous based on a comparison of a designated outlier value associated with the designated battery node with the plurality of outlier values. A battery node operation profile controlling operation of the designated battery node may be updated.

20 Claims, 19 Drawing Sheets

*200*

Receive Battery Data from one or
more Power Systems
202

Select Battery Data
204

Process Selected Battery Data to
Generate Battery Operating and/or
Testing Protocols
206

Transmit Battery Operating and/or
Testing Protocols to Power Systems
208

Present Results of Data
Analysis / BaaS
210

ANOMALOUS BATTERY NODE DETECTION AND MITIGATION SYSTEM

FIELD OF TECHNOLOGY

This patent application relates generally to battery technologies, and more specifically to the analysis of battery-related information.

BACKGROUND

Monitoring the state of safety (SoS) of battery packs is of utmost importance. Timely detection and localization of faulty cells can facilitate remedial measures, thus preventing catastrophic outcomes. However, safety algorithms implemented by traditional battery management systems (BMS) implement safety algorithms are based on simple ad-hoc rules. Such a rule-based approach does not generalize well to large-scale deployments under various conditions and usage patterns. Accordingly, improved systems and techniques for monitoring battery pack safety are desired.

SUMMARY

Techniques and mechanisms described herein provide for systems, methods, and non-transitory computer readable media for identifying and addressing an outlier battery node in a battery pack. In some embodiments, battery system diagnostic data may be received via a communication interface. The battery system diagnostic data may be generated at a plurality of battery node controllers in a battery system. Each of the battery node controllers may selectively couple a power bus in the battery system with a respective battery node including a respective one or more battery cells. The battery system diagnostic data may include a plurality of battery node diagnostic data portions that each correspond with a respective one of the plurality of battery node controllers. A trained unsupervised machine learning model may be determined by applying a machine learning model training procedure to the battery system diagnostic data. A plurality of outlier values may be determined by applying the trained unsupervised machine learning model to the plurality of battery node diagnostic data portions. A designated battery node may be identified as being anomalous based on a comparison of a designated outlier value associated with the designated battery node with the plurality of outlier values. An instruction to update a battery node operation profile controlling operation of the designated battery node may be transmitted via a communication.

According to various embodiments, the trained unsupervised machine learning model may include a plurality of neurons arranged in a plurality of layers in a neural network. The plurality of neurons may include an input layer of neurons corresponding with a battery node diagnostic data portion and an output layer of neurons corresponding with the battery node diagnostic data portion.

In some embodiments, the trained unsupervised machine learning model may include a variational autoencoder, which may encode the input layer of neurons into a latent space layer of neurons and which may decode the latent space layer of neurons into the output layer of neurons. The plurality of outlier values may be reconstruction error values. The input layer of neurons and the output layer of neurons each may have a first number of neurons. The latent space layer of neurons may have a second number of neurons that is less than the first number of neurons.

In some embodiments, the trained unsupervised machine learning model may include a clustering model. The plurality of outlier values may measure distance in a multi-dimensional space. The multi-dimensional space may be determined based on the battery system diagnostic data.

In some implementations, the trained unsupervised machine learning model may include a generative adversarial neural network. The generative adversarial neural network may include a generative network that maps from a latent space layer of neurons into the output layer of neurons. The generative adversarial neural network may include a discriminative network that discriminates between actual battery node observations and novel battery node observations generated by the generative network.

According to various embodiments, identifying the designated battery node as being anomalous may involve determining a mean of the plurality of outlier values and determining a difference between the mean of the plurality of outlier values and the designated outlier value. Identifying the designated battery node as being anomalous may also involve determining a standard deviation of the plurality of outlier values and determining a designated degree of statistical significance for the difference based at least in part on the mean of the plurality of outlier values and the standard deviation of the plurality of outlier values. The designated degree of statistical significance for the difference may surpass a designated threshold value.

In some embodiments, identifying the designated battery node as being anomalous may involve determining a outlier anomaly value based at least in part on the designated outlier value. The outlier anomaly value may surpass a designated threshold value.

In some implementations, a candidate battery node may be identified as being potentially anomalous. The candidate battery node may be associated with a designated candidate outlier value that does not surpass the designated threshold value but that is within a designated range of the designated threshold value.

In some embodiments, an instruction may be sent to accumulate a plurality of candidate outlier values for the candidate battery node over time. The candidate battery node may be identified as anomalous based on the plurality of candidate outlier values.

In some embodiments, the trained unsupervised machine learning model may be trained only after the battery system diagnostic data is received.

In some embodiments, the battery node operation profile may be a diagnostic profile in which the designated battery node is coupled to the power bus. Sensor data for the designated battery node may be collected while the designated battery node is provided current in accordance with a predetermined waveform.

In some embodiments, the battery node operation profile may be a prognosis profile in which the designated battery node is decoupled from the power bus. Sensor data for the designated battery node may be collected while the designated battery node is provided current in accordance with a predetermined waveform.

In some embodiments, the battery node operation profile may be a mitigation profile in which the designated battery node is coupled to the power bus. One or more restrictions on charging or discharging the designated battery node may be imposed.

These and other embodiments are described further below with reference to the figures.

BRIEF DESCRIPTION OF THE DRAWINGS

The included drawings are for illustrative purposes and serve only to provide examples of possible structures and operations for the disclosed inventive systems, apparatus, methods, and computer program products for battery data collection and analysis. These drawings in no way limit any changes in form and detail that may be made by one skilled in the art without departing from the spirit and scope of the disclosed implementations.

DETAILED DESCRIPTION

Figure 1A:
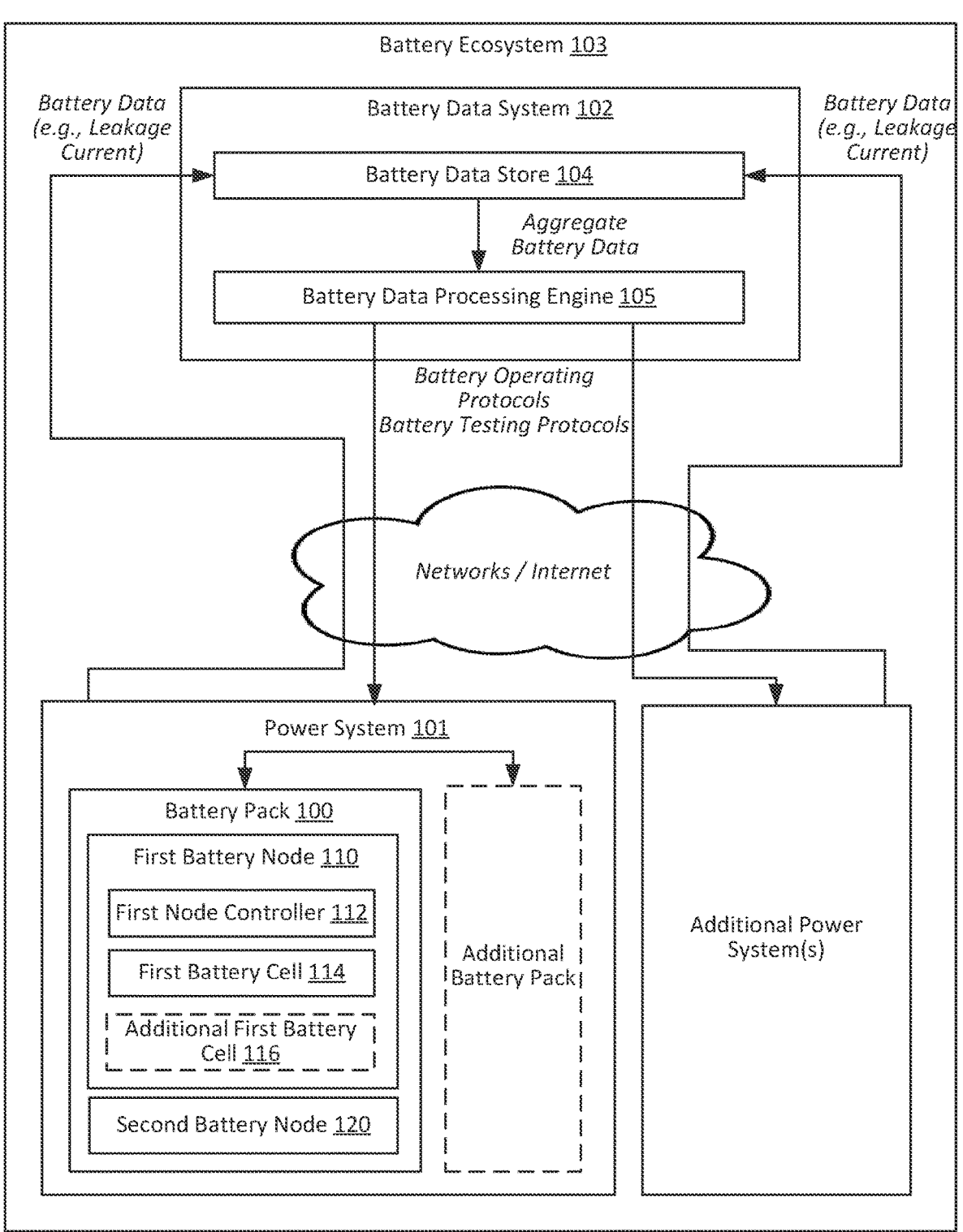
FIG. 1A is a schematic block diagram of a battery ecosystem, used for collecting and analyzing battery data from multiple power systems and developing new battery operating procedures and/or new battery testing protocols for these power systems, in accordance with some examples.

In the following description, numerous specific details are outlined to provide a thorough understanding of the presented concepts. In some examples, the presented concepts are practiced without some or all of these specific details. In other instances, well-known process operations have not been described in detail to not unnecessarily obscure the described concepts. While some concepts will be described in conjunction with the specific examples, it will be understood that these examples are not intended to be limiting.

Introduction

Techniques and mechanisms described herein provide for a data-driven AI-based approach to detecting anomalous cells in a battery pack. A battery ecosystem may include both a local analysis component that is located within a power system and a remote computing system in communication with the power system via a network. Accordingly, the battery system can evolve based on both lab-scale diagnostic data as well as large amounts of data being continuously generated in the field. As an example, in some embodiments anomalous cells may be detected by training a variational autoencoder or other type of model. For instance, a deep learning neural network model may be trained as an autoencoder to encode a high-dimensional input data set in a low-dimensional latent space, and then to decode the data stored in this low-dimensional latent space back to the original high-dimensional space associated with the input data. Then, the reconstruction error between the original input data and the output data produced by the variational autoencoder may be computed for a battery cell. As long as the model was trained mostly on data for battery cells operating normally, the reconstruction error will tend to be significantly higher for anomalous cells.

Various types of cell anomalies may be detected. As an example, one type of anomaly is excessive self-discharge. Self-discharge is an inherent characteristic of battery cells, caused by internal electrical currents within these cells. These internal currents are also referred to as leakage currents, which are used to characterize self-discharge. While leakage currents are not desirable, they are often unavoidable. Furthermore, leakage currents can change over time (e.g., as battery cells age). Finally, detecting leakage currents can be challenging.

In some examples, leakage currents vary among cells in the same battery pack. For example, battery cells of the same type (e.g., the same design, chemistry, and manufacturer) may have different leakage current characteristics resulting from unintended variations in materials, assemblies, and testing. Furthermore, different cells in the same battery pack may be subjected to different operating conditions (e.g., temperature, SOC) resulting in different levels of degradation, which affects the leakage current characteristics. The leakage current is a major indicator of the cell's degradation or lack thereof, which may be referred to as a cell's state of health (SOH) and which is also indicative of a cell's state of safety (SOS). The leakage current, if identified with sufficient precision and at certain cell conditions (e.g., temperature, SOC), can provide a strong indication of different degradation modes (or, more specifically, failure modes) of the cell, such as internal mechanical shorts, gas evolution on positive electrodes, irregularities on solid electrolyte interface (SEI) layers, metal dendrite formations on negative electrodes, and others. In some examples, a specific degradation mechanism and/or a failure mode of the cell can be identified from the corresponding leakage current data.

In some examples, the leakage current of a cell is detected based on open-circuit voltage (OCV) changes over time, often a relatively long time. The leakage current causes the cell to self-discharge, thereby reducing the SOC of the cell. As the SOC drops, the OCV of the cell also changes. As such, to determine the leakage current based on OCV changes, the cell is taken offline such that no external currents pass through the cell, and two or more OCV measurements can be performed. In some examples, the cell is taken offline for a substantial time (e.g., at least one day, at least one week) while the battery pack remains operational. This period depends on the leakage current, desired test accuracy, equipment precision, and other factors (e.g., types of cell, temperature, SOC). Overall, leakage current testing may take long periods and precise equipment for monitoring OCV. While the current disclosure focuses on OCV monitoring as an example of determining leakage current, other methods of leakage current testing are also within the scope. In another example, a cell in a selected SOC (e.g., a fully charged state or some intermediate SOC, which is known with sufficient precision) is disconnected for some time, after which the cell is charged back to this selected SOC. The charge amount needed to bring the cell back to the fully charged state (or other precisely known intermediate SOC) indicates the leakage current.

At the same time, most conventional battery applications and battery pack designs do not allow isolating individual cells for long periods, which may be needed for leakage current testing (e.g., OCV monitoring). For example, even if a battery pack is idle, certain connections in conventional battery packs (e.g., parallel connections) may limit OCV monitoring of individual cells. Aggregate leakage current data (e.g., from multiple cells) does not allow assessing the SOH of individual cells with sufficient precision. Furthermore, predicting the duration of a battery pack being idle (i.e., not operational) is often not possible, while restricting the battery pack operations for prolonged periods may not be feasible. This problem with conventional battery packs becomes even more complex when OCV monitoring is required at a particular SOC, which may be needed for determining specific degradation modes. For example, it may not be possible to determine when a battery pack will be at a certain SOC and, at the same time, will not be operational for a prolonged period, as may be required for leakage current testing.

Described methods and systems allow in-situ leakage current testing of individual battery cells in battery packs. For purposes of this disclosure, "in-situ testing" is defined as testing performed while the battery pack remains operational and continues to operate, e.g., being charged or discharged to receive charging power or provide power output to an external load. In-situ testing should be distinguished from offline testing, e.g., when the entire battery pack is taken offline and is not operational (e.g., disconnected from the external load).

In some examples, the in-situ testing is performed without any changes to the overall pack operation parameters (e.g., to the pack voltage and/or to the pack power output). Specifically, during the in-situ leakage current testing, one or more cells are taken offline for leakage current testing, while the pack continues to operate in a similar manner (e.g., as demanded by the external load). The power contributions of these tested cells (to the overall pack power output) may be compensated by one or more other cells in the pack. These other cells are operated per specific compensation profiles, which may be also referred to as a power compensation profile. As a result, the battery pack continues to operate without any disruptions (e.g., providing the same level of power). It should be noted that the pack voltage and current may be varied during testing even though the power output remains the same. It should be noted that the SOC, power, voltage, and/or current of the battery pack may change while performing in-situ leakage current testing, e.g., based on different power demands from the battery pack. However, these changes are driven by the application requirement of the battery pack (e.g., power demands) rather than by in-situ leakage current testing. It also should be noted that taking one or more cells offline (for in-situ leakage current testing) and then bringing these cells back online (after completing the in-situ leakage current testing) does not impact the overall operation of the battery pack.

When one or more battery cells are taken offline and tested, no charge or discharge currents are applied to these tested cells. In other words, the external cell current through each of the tested cells is discontinued. This external cell current should be distinguished from the leakage current, which is internal to the cell and generally cannot be controlled, at least not in the same manner as the external cell current. The external cell current should be also distinguished from a test current, which may be used for leakage current testing (e.g., charging a tested cell with a current equivalent to a leakage current to maintain the same SOC of the tested cell). The external cell current contributes to the power output of the battery pack while the pack charges or discharges.

In some examples, once one or more battery cells are taken offline by discontinuing external currents through these cells, two or more OCV measurements are taken for each of these tested cells over a time period to determine the leakage current of this cell. In more specific examples, multiple OCV measurements are taken, e.g., to establish an OCV profile or a time series. In some examples, the duration of the test is initially unknown. Instead, the duration is dynamically established based on the measured OCV changes and the desired test precision. Furthermore, in some examples, in-situ leakage current testing is repeated for different SOCs, different cell temperatures, and/or other like factors. In some examples, the process may involve capturing a temperature profile corresponding to a captured OCV profile, e.g., measure both the OCV and temperature of the cell over a test period. Furthermore, the temperature profile is taken into account when analyzing the OCV profile.

When a battery cell is taken offline (i.e., removed from the operation of the battery pack and tested with no external cell current passing through the battery cell), the battery cell stops contributing to the total power output of the battery pack. While various references are made to "power output" of a battery pack/cell, one having ordinary skill in the art would understand that this term encompasses both the power supplied and the power received by the battery pack/cell. For example, in-situ leakage current testing may be performed while charging or while discharging the battery cell. Furthermore, the overall operation continuity during individual cell testing may be expressed in terms of the pack voltage, which remains substantially the same while changing the current through one or more battery cells.

As noted above, the change in the power output contribution from the tested cell is offset and compensated by one or more other cells in the battery pack. These one or more cells may be referred to as power compensating cells and may include cells from the same nodes (as the tested cell) and/or different nodes. As such, during in-situ leakage current testing, a battery pack includes one or more tested cells and one or more power compensating cells. In more specific examples, the battery pack also includes one or more other cells, which are neither tested nor used for power compensation. These other cells may be referred to as regular operating cells. Alternatively, all cells that are not tested for leakage current are compensating cells, e.g., equally distributing the power compensation.

It should be noted that the leakage current testing of a particular cell may be initiated based on various triggers. Some examples of these test triggers include, but are not limited to, operating history (e.g., reaching or exceeding one or more operating limits, such as cut off voltages and/or charge rates) of this cell or of the pack as a whole (e.g., after a high rate charge or discharge, after being exposed to high temperature), test history (e.g., previous leakage current and/or other data, identified degradation modes and severity of these degradation modes) of this cell or the pack as a whole, current conditions of the cell and/or the power pack (e.g., SOC, temperature, OCV, voltage under a certain load), data analysis (e.g., of test and other data from battery cells equivalent to first battery cell 114), and other like trigger points. For purposes of this disclosure, equivalent battery cells are defined as cells with the same design (e.g., materials, form-factor) or at least the cells sharing one or more common characteristics (e.g., materials). For example, a leakage current testing is triggered after a high-rate charge of the cell, upon reaching a certain SOC (e.g., at least 90%). In more specific examples, the minimum SOC threshold is used, e.g., because the leakage current is more detectable at the higher SOC. Furthermore, a cell with a high SOC has enough remaining capacity when the cell is brought back online and used to supply the power to the power pack. Furthermore, the leakage current measurement at a high SOC (at least 90% of the maximum operating capacity) may be used to determine specific degradation and safety deterioration mechanisms as further described below. Testing may be performed at a specific SOC corresponding to a tested degradation mode. Some examples of these degradation and safety deterioration mechanisms include, but are not limited to, oxidation on positive electrodes, reduction on negative electrodes (e.g., gassing), and/or presence or development of mechanical shorts in the cell (e.g., dendrites, loose particles). Other degradation and safety deterioration mechanisms include dissolution and/or cracking of negative electrode substrates, corrosion of positive electrode substrates, loss of contact with negative electrode substrates and/or positive electrode substrates, SEI decomposition and precipitation, excessive SEI formation, cracking of active material particles, the formation of cathodic surface films, polymer binder decomposition, and others. As further described below, these results may be used for various purposes, e.g., changing frequency of future tests, performing different types of test schedule, service/maintenance/replacement of the battery pack, permanently or temporarily bypass the cell, changing operating parameters of the cell, the node, and/or the pack, such as cut off voltages and/or charge rates. In some examples, operating parameters may be also referred to as operating limits (e.g., maximum charge/discharge rates).

For example, in a lithium-ion cell, a standard discharge corresponds to lithium ions de-intercalating from the negative electrode, migrating to the positive electrode through the separator and intercalating into the positive electrode, as represented by the following formulas:

$$Li_2C_2O_4 + Y^*Li_xC_6 \rightarrow 2CO_2 + 2Li^+ + Y^*Li_{x-2/Y}C6 + 2e- \text{(negative electrode)}$$

$$2CO_2 + 2Li^+ + Z^*Li_{W+2/Z}MO_2 + 2e- \rightarrow Li_2C_2O_4 + Z^*Li_WMO_2 \text{(positive electrode)}$$

The process is reversed during a charge. At the same time, electrons travel through the external load, with a 1-to-1 ratio between the lithium-ion transfer and the electron transfer.

During a self-discharge, there is no external pathway for the conduction of electrons. Instead, a shuttle mechanism takes place internally between the two electrodes. For instance, decomposition byproduct ($CO_2$) of the oxidation of electrolyte at the positive electrode can migrate to the negative electrode. Upon reaching the negative electrode, this byproduct is reduced in a reaction that consumes two lithium ions and two electrodes from the negative electrode, as represented by the following formula:

$$2CO_2 + 2Li^+ + Y^*Li_{x-2/Y}C6 + 2e- \rightarrow Li_2C_2O_4 + Y^*Li_xC6$$

The byproduct ($Li_2C_2O_4$) of this reduction reaction then migrates to the positive electrode where this byproduct gets oxidized and provides two Lithium ions and two electrons to the positive electrode, as represented by the following formula:

$$Li_2C_2O_4 + Z^*Li_WMO_2 \rightarrow 2CO_2 + 2Li^+ + Z^*Li_{W+2/Z}MO_2 + 2e-$$

One having ordinary skill in the art would understand that the above description represents a general framework of self-discharge within lithium-ion cells.

In some examples, an SEI layer is damaged (e.g., due to high temperature, high-rate charge/discharge operations). When the SEI layer is damaged, highly reactive particles of the negative electrodes (in the damaged portion) are exposed to and interface the electrolyte. The electrolyte gets reduced at this interface with the negative electrode to form a fresh SEI layer, effectively to repair the damaged area. In this reduction/repair reaction, lithium ions and electrons are sourced from the negative electrode as represented by the following formula:

$$Electrolyte(liquid) + Li_+ + Y^*Li_{x-1/Y}C6 + e- \rightarrow SEI (solid) + Y^*Li_xC6$$

A decrease in the lithium concentration in the negative electrode raises the potential of the negative electrode, which in turn translates into a decrease in the OCV of the cell, which can be measured. As such, in some examples, the OCV decrease is an indication of an SEI damage/repair process.

In some examples, when the lithium metal plates on the negative electrode, a portion of electrolyte interfaces highly reactive metallic lithium. The electrolyte gets reduced at the interface with the metallic lithium to form a new SEI layer to passivate the surface of the plated lithium. In this reduction reaction, presented below, lithium ions and electrons are sourced from the plated lithium and represented by the same formula as the one. As with the SEI layer damage, there is a decrease in the lithium concentration in the negative electrode, which in turn translates into a decrease in the OCV of the cell, which can be detected using the methods and systems described herein.

In some examples, when lithium plating reaches a certain level, lithium dendrites form on the negative electrode. At a certain size, the lithium dendrites can pierce through the separator and create an electrically conductive bridge between the two electrodes, which allows electrons to flow from the negative electrode to the positive electrode within the cell. When electrons are transferred in that manner, lithium-ions de-intercalate from the negative electrode, migrate toward the positive electrode and intercalate into the positive electrode. This overall process corresponds to the drop in the SOC, which is evident from the OCV decrease and which can be detected during in-situ leakage current testing. In some examples, internal shorts are caused by various particles or debris inside the cell, e.g., current collector burrs, electrode flakes, and others. Furthermore, in some examples, internal shorts are caused by mechanical damage and/or an over-pressure event, which causes direct contact to be established between both electrodes by compressing the separator. In some examples, the external terminals of a cell are shorted externally, which creates an electrically conductive bridge between the two electrodes, like the internal shorts described above.

Overall, repeated testing of leakage current at different cell conditions (e.g., SOC, temperature, etc.) on individual cells can assist in the early detection of different degradation mechanisms. The early detection allows implementing various mitigation plans, such as scheduling predictive maintenance operations and/or determining new operating parameters at the individual cell level. For example, leakage current may be used to determine when certain cells and/or nodes should be kept offline (e.g., completely bypassed) even after completion of in-situ leakage current testing and during operations. More specifically, if a measured leakage current for a cell is larger than a set threshold, then the cell is first controllably discharged and taken offline. Alternatively, a test result may be used to determine less stressful operating parameters (e.g., reduced current rates and power levels, different cut off voltages) for one or more cells in the battery pack. In some examples, each cell may be operated according to its individual set of operating parameters, which are developed and updated based on periodic in-situ leakage current testing of this cell.

The results of leakage current testing may be used at a pack level, e.g., by a battery pack controller, to adjust operating parameters of the tested cell. Furthermore, the results may be shared in a battery ecosystem and collectively used together, e.g., with data from other battery packs/across a fleet of power systems comprising battery packs, equivalent to the battery pack with the tested cell. For example, a battery pack may be a part of a power system (e.g., an electric vehicle, a power backup system). Each power system may contain one or more battery packs. The power system, or the battery pack directly, may supply various battery data (e.g., results of leakage current testing) to a central battery data store. The aggregate data in this central battery data store is collectively analyzed to determine various global trends and anomalies, identify specific design concerns, pinpoint production batches with potential defects, and other purposes. This global data analysis may be referred to as a big data analysis because this analysis involves data across multiple battery packs. This analysis may yield various new battery operating protocols and/or battery testing protocols. Furthermore, the analysis may yield various recommendations related to battery designs (e.g., materials, construction, and others). Additional examples of global data analysis are described below with reference to FIG. 2A.

Battery Ecosystem Examples

As noted above, multiple battery cells are often assembled into a battery pack to provide higher power output and/or higher energy storage capacity. Battery packs, in turn, are often used as parts of various higher-level power systems, such as electric vehicles, stationary energy storage systems, grid balancing systems, and others. In some examples, one power system comprises multiple battery packs.

Many modern power systems have communication capabilities for receiving and sharing information. In some examples, these communication capabilities are used for receiving and sharing information related to battery pack operation or, more specifically, to operation and testing of individual cells assembled into the packs. Some examples of this information include, but are not limited to, leakage current testing results, leakage current testing protocols, power compensation protocols, cell operating protocols (e.g., for particular leakage current and/or degradation mode results), outlier (or unsafe) cell identification, degradation-mode determination protocols, fault reaction, and others. This information may be collectively referred to as battery data.

In some examples, the battery data (from multiple different power systems) is aggregated to perform data analysis for multiple different battery cells, multiple different power packs, and/or multiple different power systems. The aggregate data analysis has multiple additional benefits in comparison, e.g., to the data analysis of an individual cell. For example, an aggregate data analysis may involve data from cells having different cycle lives, which provides various insights into cell aging (e.g., changing in leakage current over the operating lifetime). In another example, an aggregate data analysis may involve data from cells operated at different parameters (e.g., charge rates, temperatures, cutoff voltages), which provides insights into effects of these operating parameters on the SOH and/or SOS of the cells. Other examples of aggregate data analysis are also within the scope. In general, information about one set of battery cells (and battery packs formed from these cells) may be relevant for another set of battery cells. For example, battery cells in both sets may be of the same type.

Overall, aggregate battery data and aggregate data analysis may be used to identify unsafe cells and cells with reduced performance capabilities, identify ways of mitigating risks and performance degradation associated with these cells (e.g., taking cells offline, developing new operating protocols/strategies), new test protocols, new battery cell and/or pack designs, and others. For purposes of this disclosure, the sharing of battery data among different power systems is performed within a battery ecosystem. A battery ecosystem may be managed by a manufacturer of power systems (e.g., electric vehicles), a consortium of different manufacturers, a third party, and others.

FIG. 1A is a schematic illustration of battery ecosystem 103, in accordance with some examples. Battery ecosystem 103 comprises power system 101 and, optionally, one or more additional power systems. Each of these power systems comprises at least one battery pack. For example, FIG. 1A illustrates power system 101 comprising battery pack 100 and an optional additional battery pack. Any number of packs in a power system and any number of power systems within a battery ecosystem are within the scope. Battery pack 100 comprises multiple battery nodes, such as first battery node 110 and second battery node 120, as further described below with reference to FIG. 1B.

Battery ecosystem 103 also comprises battery data system 102, which is communicatively coupled (e.g., via various networks and/or internet) to each of the power systems, such as power system 101. Battery data system 102 comprises battery data store 104 and battery data processing engine 105. Battery data store 104 is configured to receive battery data (e.g., results of leakage current testing) from various power systems and store this battery data. This battery data, in battery data store 104, may be referred to as aggregate battery data. In some examples, this aggregate battery data comprises individual cell data (e.g., results of leakage current testing of individual cells). In more specific examples, this aggregate battery data also comprises pack level data and/or power system-level data.

Battery data store 104 also provides this aggregate battery data to battery data processing engine 105 for various types of analysis, such as deterministic analysis, outlier detection, classification, linear regression, forecasting, histogram generation, and others. In some examples, battery data processing engine 105 comprises a self-learning module.

In some examples, battery data processing engine 105 is configured to generate/revise battery operating protocols and/or battery testing protocols, as further described below with reference to FIG. 2A. For example, battery data processing engine 105 may revise a previously-used battery operating protocol based on the results of a recent leakage current testing.

In some examples, these battery operating protocols and battery testing protocols are transmitted to various power systems and used by the power systems for operating and testing batteries, e.g., determining leakage current describe below with reference to FIG. 2B.

Battery Pack Examples

Figure 1B:
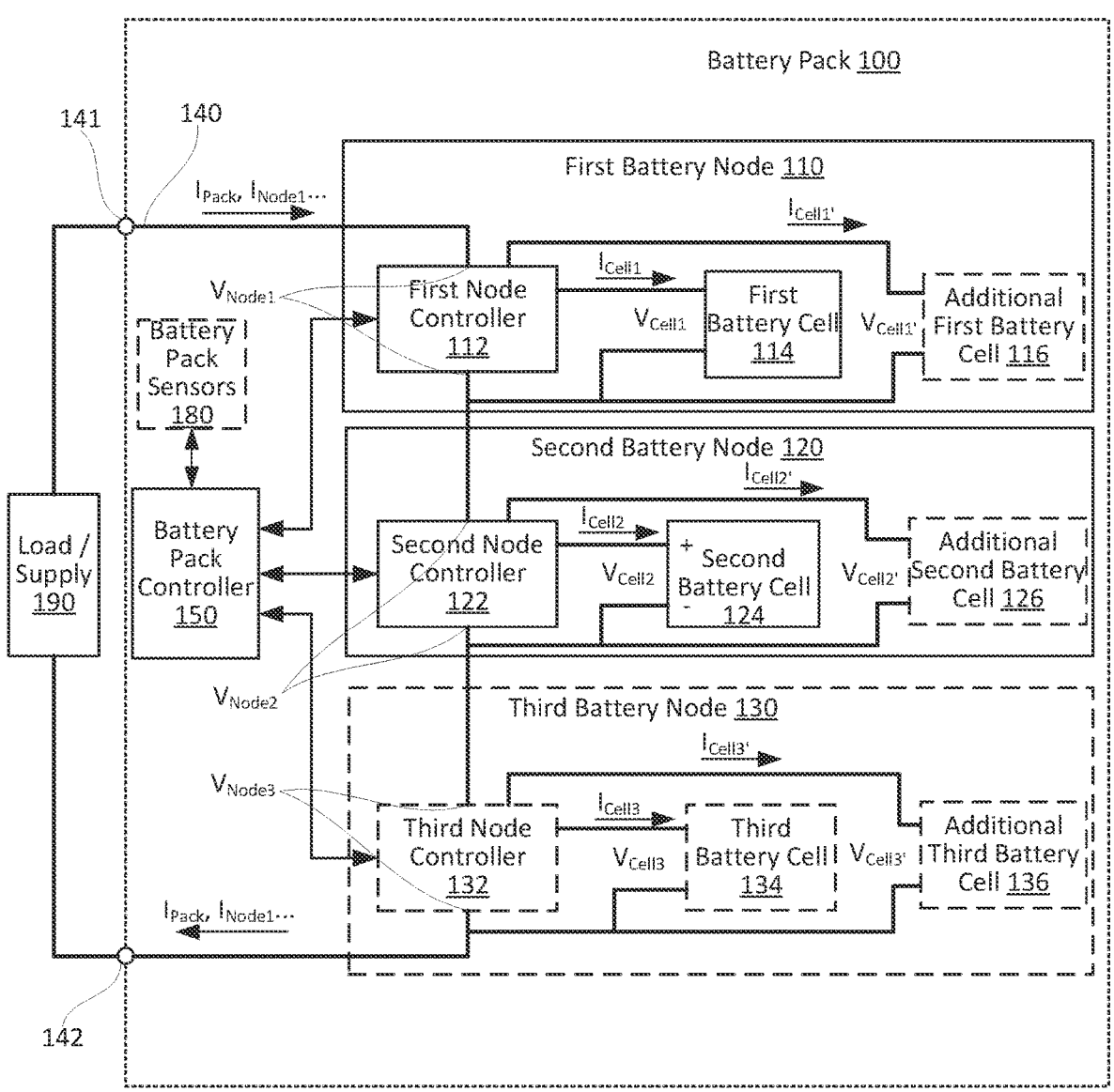
FIG. 1B is a schematic block diagram of a battery pack, comprising multiple battery nodes, interconnected in series and controlled by a battery pack controller, in accordance with some examples.

FIG. 1B is a schematic illustration of battery pack 100 configured for in-situ leakage current testing of battery cells in battery pack 100, in accordance with some examples. Battery pack 100 comprises at least two battery nodes, e.g., first battery node 110, second battery node 120, and third battery node 130. Each battery node comprises at least one cell. As such, battery pack 100 may be referred to as a multi-cell battery pack. In some examples, battery pack 100 comprises tens, hundreds, and even thousands of battery nodes. The number of nodes depends on the desired power output of battery pack 100, the power output of each battery cell, the number of cells in each node, operating characteristics of node controllers in each node, and other like factors. In the following description, references will be made primarily to first battery node 110 and second battery node 120. However, one having ordinary skill in the art would appreciate that described features apply to additional battery nodes, which are optional.

Each battery node comprises a node controller and at least one battery cell. Referring to FIG. 1B, first battery node 110 comprises first node controller 112 and first battery cell 114, connected to and controlled by first node controller 112. More specifically, first node controller 112 controls electrical connections of first battery cell 114 to the remaining components of first battery node 110. These electrical connections may be also referred to as electrical power connections to distinguish from testing connections to first node controller 112, such as voltage leads used to monitor the OCV or supplying a small current to first battery cell 114 to maintain a constant SOC during the leakage current testing. Similarly, second battery node 120 comprises second node controller 122 and second battery cell 124, connected to and controlled by second node controller 122. Finally, third battery node 130, if present, comprises third node controller 132 and third battery cell 134, connected to and controlled by third node controller 132. Second node controller 122 and third node controller 132 may be referred to as additional node controllers.

In some examples, at least one battery node comprises one or more additional batteries, which are optional. For example, FIG. 1B illustrates first battery node 110 also comprising additional first battery cell 116, independently connected to and controlled by first node controller 112. More specifically, first node controller 112 controls first battery cell 114 and additional first battery cell 116, independently from each other. In some examples, first battery node 110 comprises multiple battery cells, which are controlled together (e.g., as a unit) by first node controller 112. The cells within this unit may be interconnected in series, parallel, or various combinations of these methods. Similarly, second battery node 120 comprises additional second battery cell 126, also connected to and controlled by second node controller 122, independently from second battery cell 124. While FIG. 1B illustrates two battery cells in each of first battery node 110 and second battery node 120, each battery node can have any number of battery cells, e.g., one, two, three, four, or more. The number of battery cells per node is determined by the control capability of the node controller at this node as well as the power ratings of the power converter in the corresponding node controller. Furthermore, the number of cells in different nodes may be the same (e.g., as in FIG. 1B) or different. FIG. 1B also illustrates third battery node 130, comprising additional third battery cell 136, also connected to and controlled by third node controller 132, independently from third battery cell 134. As noted above, third battery node 130 is optional. Furthermore, if third battery node 130 is present, third battery node 130 may include any number of battery cells.

Figure 1C:
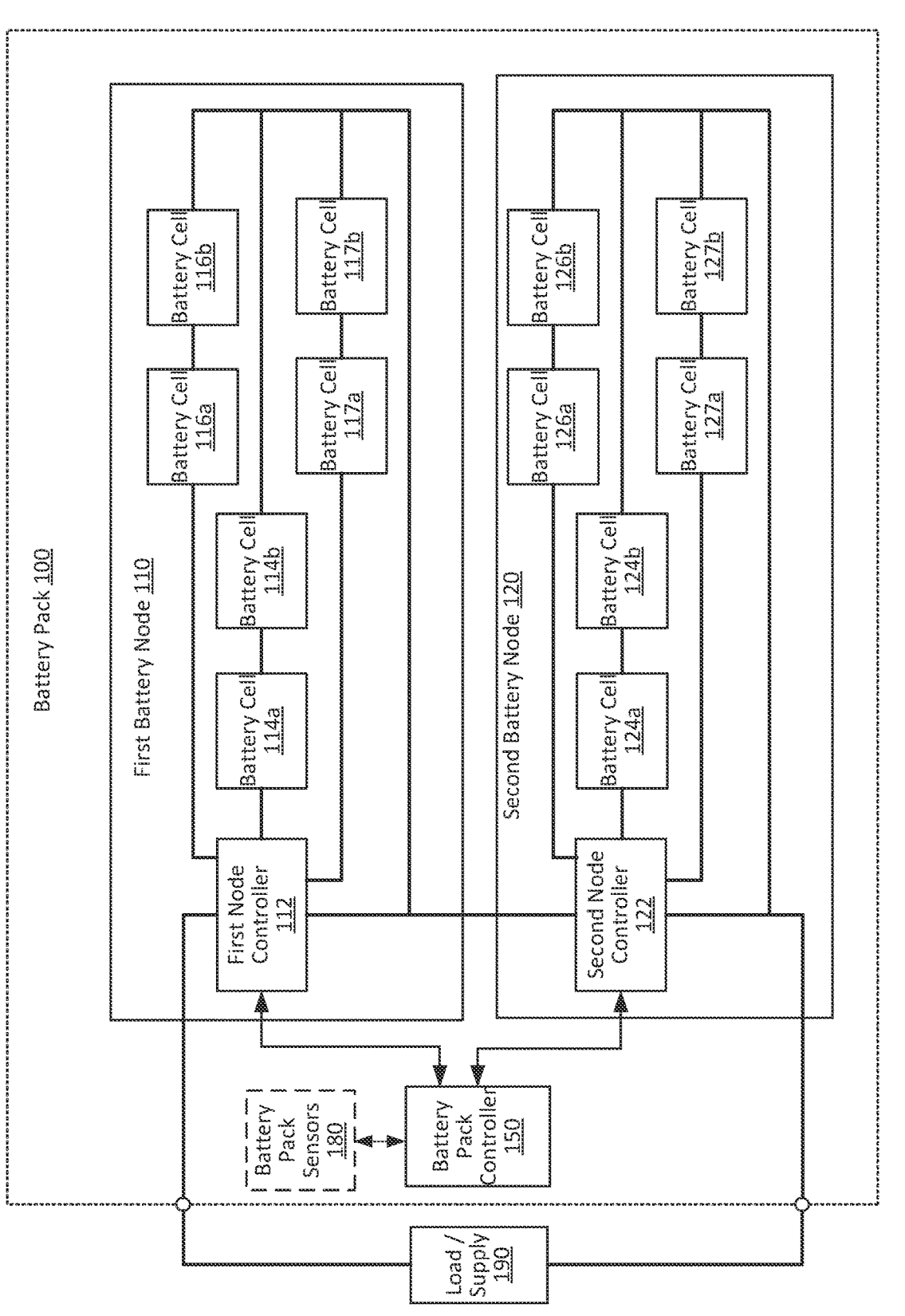
FIG. 1C is a schematic block diagram of another example of a battery pack, comprising multiple battery nodes, interconnected in series and controlled by a battery pack controller.

FIG. 1C illustrates another example of battery pack 100. In this example, each node comprises six cells, forming three sets connected in parallel to each other. Each set comprises two cells connected in series with each other within the set. Specifically, first battery node 110 comprises battery cells 114a and 114b (interconnected in series with each other, and forming a first set), battery cells 116a and 116b (interconnected in series with each other, and forming a second set), and battery cells 117a and 117b (interconnected in series with each other, and forming a third set). Each of these sets is connected in parallel to first node controller 112, which independently controls the operation of each set. Similarly, second battery node 120 comprises battery cells 124a and 124b (interconnected in series with each other, and forming a first set), battery cells 126a and 126b (interconnected in series with each other, and forming a second set), and battery cells 127a and 127b (interconnected in series with each other, and forming a third set). Each of these sets is connected in parallel to second node controller 122, which independently controls the operation of each set. This configuration may be referred to as a 3P/2S node. In this configuration, current testing may be performed on each set or individual cells (e.g., using separate voltage leads, which are not shown in FIG. 1C). In general, any configuration of each battery node is within the scope. A node with multiple cells (e.g., eight cells, twelve cells) may be also referred to as a battery pack module, a battery module, a cell module assembly, or a module. The cells of each module may have various types of connections with each other and a corresponding node controller. In some examples, the entire module is taken offline for testing one or more (e.g., all) cells of this offline module. Alternatively, only a subset of cells in a module is taken offline, while remaining cells remain operational.

The battery nodes are connected in series by bus 140. In more specific examples, the node controllers of different battery nodes are connected in series by bus 140. Individual connections of one or more battery cells, within each node, are controlled by the node controller of this node. The ends of bus 140 are coupled to or form battery pack terminals, such as first battery pack terminal 141 and second battery pack terminal 142. During operation of battery pack 100, load/supply 190 is connected to the battery pack terminals to supply power to battery pack 100 and/or to receive power from battery pack 100, which is collectively referred to as power output. Overall, battery pack 100 may provide a direct current (DC) power or an alternating current (AC) power (e.g., when power converters of node controllers are also configured to invert the DC power, supplied by the battery cells, to the AC power at the battery pack terminals).

Referring to FIG. 1B, battery pack 100 also comprises battery pack controller 150, which is communicatively coupled to each node controller. Battery pack controller 150 controls operation of each node controller, which in turn controls the operation of each battery cell. For example, battery pack controller 150 instructs first node controller 112 to discontinue the electrical current through first battery cell 114, for the in-situ leakage current testing of first battery cell 114. In other words, battery pack controller 150 instructs first node controller 112 to bring first battery cell 114 offline to initiate the in-situ leakage current testing of first battery cell 114. Battery pack controller 150 also receives OCV measurements from first battery cell 114, during the in-situ leakage current testing of first battery cell 114 and while no current is flowing through first battery cell 114.

Battery pack controller 150 is also configured to maintain the power output and the overall operation of battery pack 100 such that this power output is not impacted by in-situ leakage current testing. For example, when first node controller 112 discontinues the current through first battery cell 114, battery pack controller 150 also instructs first node controller 112 and/or one or more of other node controllers to compensate for the power output changes associated with taking first battery cell 114 offline. This power compensation may be provided by a battery cell at the same node (e.g., additional first battery cell 116) and/or one or more cells at one or more other nodes (e.g., second battery cell 124). In some examples, multiple cells are used for this power compensation, even when only one battery cell is taken offline. Spreading the power compensation over multiple battery cells allows reducing the change in charge/discharge current through each cell.

In general, battery pack controller 150 is configured to select one or more cells for this power compensation, based on various factors, such as the pack current power output, expected power output, the SOC of each battery cell, power and control capabilities of a power converter in each node controller, and others. Furthermore, the initial selection of battery cells (for this power compensation) may change over time, e.g., by using additional cells for power compensation. Additional features of battery pack controller 150 are described below with reference to FIG. 1E. Battery pack controller 150 should be distinguished from node controllers, which provide a node-level control. Battery pack controller 150 provides a pack-level control, e.g., synchronizing operations of different node controllers.

Referring to FIG. 1B, in some examples, battery pack 100 also comprises battery pack sensors 180, communicatively coupled to battery pack controller 150. Some examples of battery pack sensors 180 include but are not limited to one or more thermocouples (e.g., thermally coupled to individual battery cells), Hall effect sensors, voltage probes (e.g., electrically coupled to terminals of each battery cell), current shunts, ultrasound sensors, pressure sensors, magnetic sensors, piezo sensors, gas sensors, and others. In some examples, the output of the sensors may be used to trigger in-situ leakage current testing (e.g., when a battery is at a particular voltage and/or temperature). Furthermore, the output of the sensors (e.g., voltage probes) may be used to collect the OCV data during in-situ leakage current testing and/or supplement the OCV data. For example, the temperature data obtained by a thermocouple may be correlated with the OCV data (and, optionally, with other battery data), e.g., for the local analysis by battery pack controller 150 and/or for the global analysis by battery data system 102. In some examples, the process involves developing a weighted temperature cost function that when combined with time and OCV readings, allows a more precise correlation of OCV changes/leakage current (relative to an example not accounting for temperature).

The architecture of battery pack 100, described above and schematically shown in FIG. 1B, enables various functions and other features, which are not available in conventional battery packs (with direct in series and/or parallel connections among battery cells). As noted above, this architecture allows in-situ leakage current testing of individual battery cells, while battery pack 100 remains operational. This testing is performed without any impact to the overall pack power output. Furthermore, this architecture allows interconnecting in series a large number of battery nodes, without individual cells' performances compromising the performance of the overall pack. The performance of each cell is maximized by periodic and individual testing of each cell, e.g., for leakage current. The test results are used, for example, to uniquely operate each cell.

A brief description of node controllers, used in battery pack 100, is presented herein to provide additional detail of the individual cell control. In some examples, a node controller comprises a power converter, which provides DC-DC conversion and/or DC-AC conversion functionality for each cell connected to the power converter. For example, the power converter may be configured to step-up or step-down the voltage of first battery cell. The node controller is configured to take offline and bring online each battery cell in this node, e.g., either individually or as a set (e.g., when multiple cells in the same node are connected in series). A node controller also determines, based on the input from the battery pack controller 150, the contribution level of the cell current to the node current. This contribution is controlled using, e.g., the duty cycle of the power converter in the node controller, which provides a voltage conversion from the cell level to the node level.

Due to the in-series connections of the nodes, the current flowing through each node is the same ($I_{BUS}=I_{NODE1}=I_{NODE2}=\ldots$). The bus voltage is the sum of all node voltages ($V_{BUS}=V_{NODE1}+V_{NODE2}+\ldots$). However, the cells are functionally isolated from bus 140 by their respective node controllers. The architecture of the battery pack shown in FIG. 1B allows the cell voltage and the cell current to be different from the corresponding node voltage and the node current. As noted above, this difference is determined by the duty cycle of the power converter. Assuming negligible power losses at the node controllers, the combined power output of all cells in the node (e.g., $P_{CELL}=V_{CELL}\times I_{CELL}+V_{CELL'}\times I_{CELL'}$ for the two-cell example) is the same as the power output of the node ($P_{NODE}=V_{NODE}\times I_{NODE}$). In other words, the relationship between the cell voltage and the cell current as well the node voltage and the node current are as follows: $V_{CELL}\times I_{CELL}+V_{CELL'}\times I_{CELL'}=V_{NODE}\times I_{NODE}$. When a node has only one cell, this equation reduces to $V_{CELL}\times I_{CELL}=V_{NODE}\times I_{NODE}$.

The node current is determined by the overall power output of battery pack 100, e.g., determined by load/supply 190 connected to battery pack 100. When no electrical current is flowing through the cell ($I_{CELL}=0$) and there are no other cells in this node, the voltage across the node is also zero ($V_{NODE}=0$). With additional cells at the node, the voltage across the node may be maintained, fully or partially, by these other cells.

Continuing with the single cell per node example, in some examples, the entire node current is flowing through the cell ($I_{CELL}=I_{NODE}$). In these examples, the voltage across the cell is the same as the voltage across the node ($V_{CELL}=V_{NODE}$), and the node controller is operable as a simple connector between the cell and bus 140. In other examples, the cell voltage is different from the node voltage (e.g., $V_{CELL} < V_{NODE}$ for a step-up conversion or $V_{CELL} > V_{NODE}$ for a step-down conversion).

Continuing with the single-cell per node example, when a cell is taken offline and no electrical current is flowing through this cell ($I_{CELL} = 0$), e.g., for in-situ leakage current testing, one or more other nodes compensate for any power changes associated with this offline switch. This may be referred to as global power loss compensation or external power loss compensation across multiple nodes in battery pack 100.

With multiple cells present at the same node, the node controller independently controls each cell or a set of the cells (e.g., when multiple cells in the same nodes are connected in series). The combined power output of multiple cells is the same as the power output of the node ($P_{NODE} = P_{CELL1} + P_{CELL2} + \ldots$). The relationship between the cell voltages and the cell currents as well the node voltage and the node current are more complicated than, e.g., in the previous example with a single cell per node. With multiple cells, this relationship takes the following form: $V_{NODE} \times I_{NODE} = V_{CELL1} \times I_{CELL1} + V_{CELL2} \times I_{CELL2} + \ldots$.

In this example with multiple cells per node, when one cell is taken offline and no electrical current is flowing through this cell ($I_{CELL} = 0$), one or more other cells at this node may entirely compensate for any power changes associated with taking the first cell offline. This may be referred to as a local power loss compensation. Alternatively, one or more other nodes compensate for any power changes associated with taking the first cell offline, even for the multiple cells per node example. Finally, the power compensation may come from both within the same node (e.g., other cells) and one or more other nodes, which may be referred to as hybrid power loss compensation.

Figure 1D:
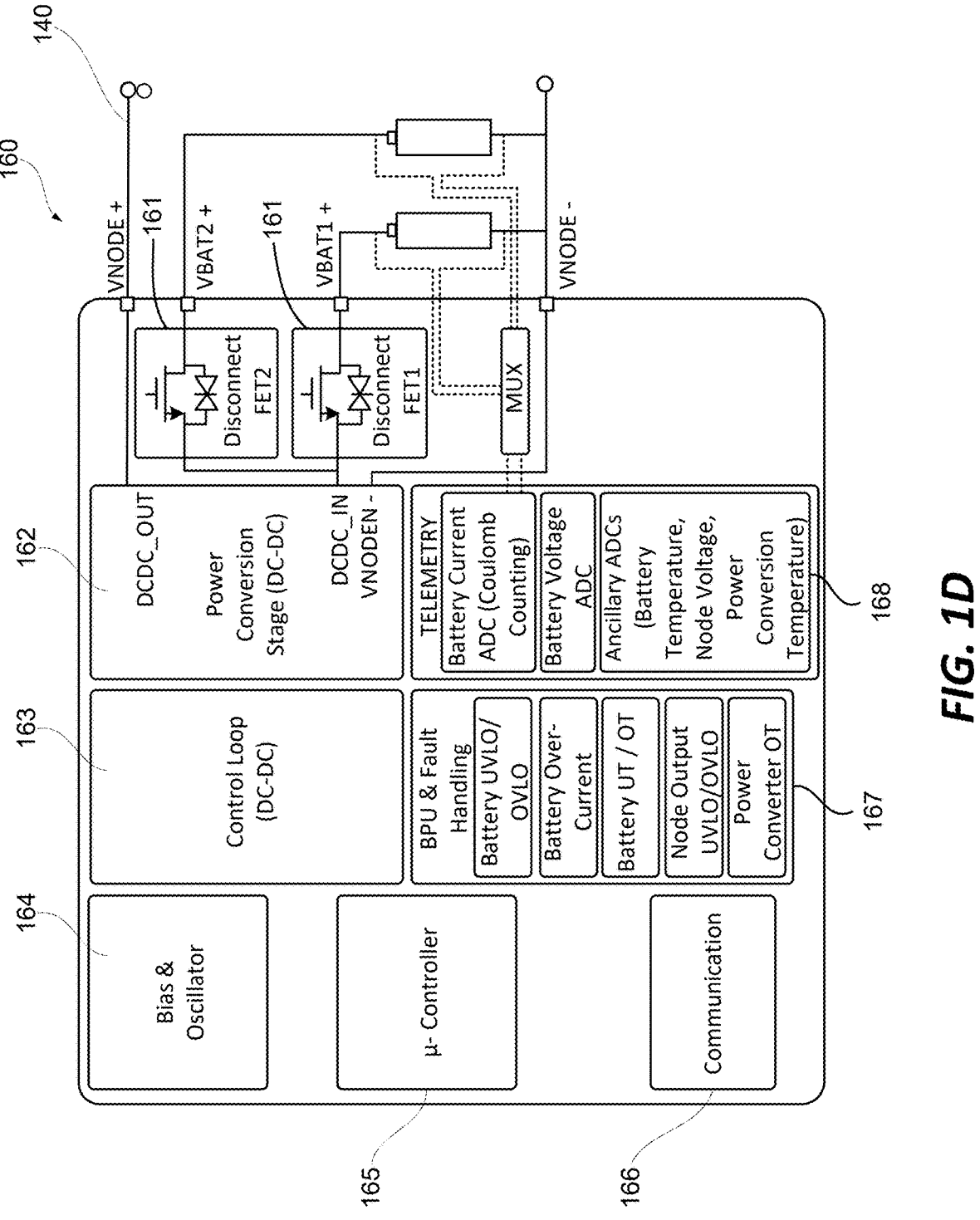
FIG. 1D is a schematic block diagram of a node controller, used in each node of a battery pack, in accordance with some examples.

FIG. 1D is a schematic illustration of node controller 160 used for controlling a single battery cell, in accordance with some examples. Node controller 160 represents any one of power converters shown in FIG. 1B. Node controller 160 comprises one or more switches 161, which may be a field-effect transistor (FET) switch as, for example, is shown in FIG. 1D. Each switch is configured to connect and disconnect a corresponding battery cell from bus 140. It should be noted that the battery cells and bus are shown in FIG. 1D for context and these components are not parts of node controller 160. In some examples, one or more switches are configured to bypass an electrical current through the first battery node 110.

In some examples, node controller 160 comprises bias and oscillator module 164. The bias part of this module sets the internal fixed voltage and current levels for other parts of node controller 160 (e.g., for controlling switches 161). The oscillator part provides a configurable clock signal for other parts of node controller 160, such as communication, FET switching, and analog-to-digital converters (ADCs). In some examples, node controller 160 comprises μ-Controller 165, which coordinates various node operations. Specifically, μ-Controller 165 is configured to execute the embedded control logic (e.g., software, firmware). In some examples, node controller 160 comprises communication module 166, which handles communication with other nodes and battery pack controller 150. In some examples, node controller 160 comprises control loop 163, which is configured to adjust switching characteristics of power conversion stage 162, e.g., to regulate the desired node output voltage and power. A combination of power conversion stage 162 and control loop 163 may be referred to as a power converter.

In some examples, node controller 160 comprises battery protection unit (BPU) and fault handling module 167. BPU and fault handling module 167 is configured to monitor the battery voltage and voltage conversion levels as well as corresponding currents. In some examples, BPU and fault handling module 167 is also configured to monitor temperatures of various components of node controller 160 and battery cells. Monitoring various other abnormal states of node controller 160 is also within the scope. In some examples, BPU and fault handling module 167 is configured to trigger various corrective actions (e.g., trigger a bypass). In some examples, node controller 160 comprises power conversion stage 162, which steps up or down the voltage level from the cell-side to the bus-side. In some examples, node controller 160 comprises telemetry module 168, which is configured to process various measurements (e.g., ADCs, voltage, current, temperature). Telemetry module 168 may also report the measurements to control loop 163, BPU and fault handling module 167, and external devices (e.g., battery pack controller 150) using communication module 166. In some examples, the quiescent operating current of node controller 160 is at least 10 times, 100 times, or even 1,000 times lower than a typical leakage current of battery cells. This much lower leakage current is achieved by using ADCs with large input impedance and/or by sampling the voltage infrequently (e.g., a 1-second measurement every hour). For example, a self-discharge of 1% SOC per month for 100 Ah cell corresponds to a leakage current of about 1.4 mA. In this example, the ADC bias is about 10 μA to 100 μA or 40 kΩ to 400 kΩ impedance to achieve the 10-100× factor.

Figure 1E:
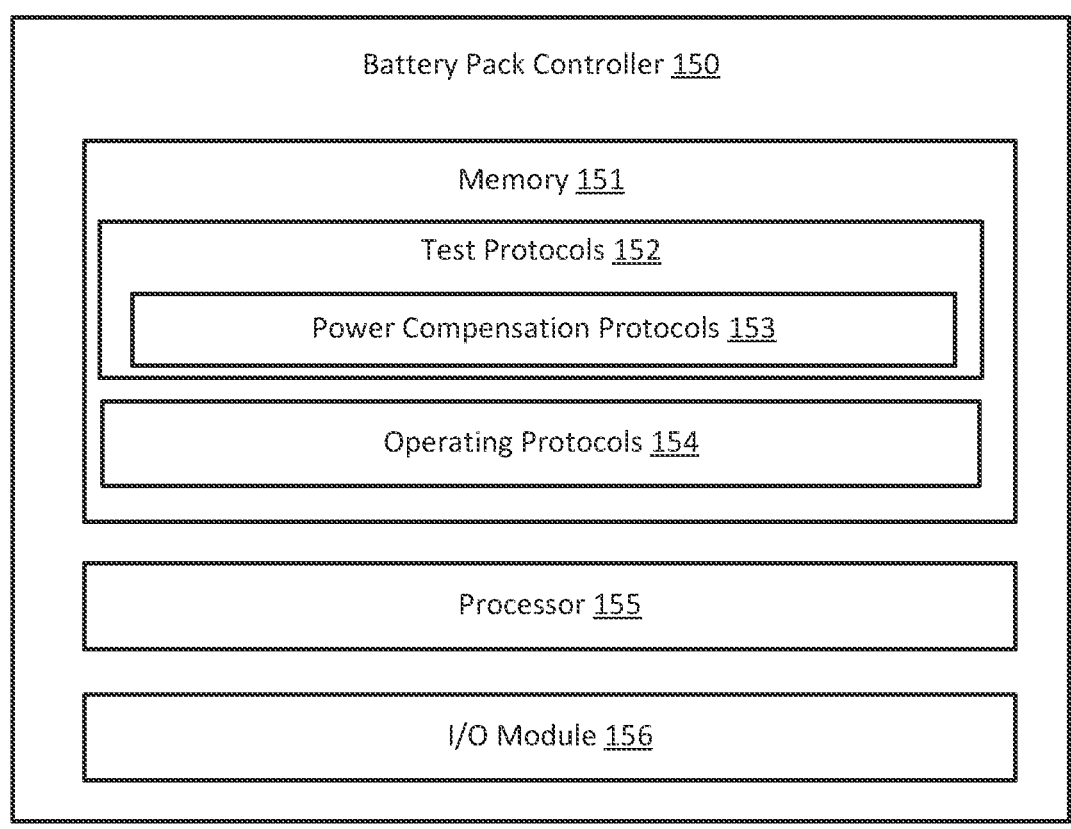
FIG. 1E is a schematic block diagram of a battery pack controller, showing various components and features, used by the battery pack controller to control operations of each node in a battery pack, in accordance with some examples.

FIG. 1E is a schematic illustration of battery pack controller 150, in accordance with some examples. Battery pack controller 150 comprises memory 151, configured to store various criteria for initiating in-situ leakage current testing, test protocols 152 (e.g., starting SOC, duration, desired precision), power compensation protocols 153, operating protocols 154, and test results. Some examples of these criteria include, but are not limited to, duration since the last test, exceeding certain threshold parameters (e.g., thresholds for charge/discharge currents, upper/lower temperatures) during cell operation, and others. Other examples are described below.

Battery pack controller 150 also comprises processor 155, which is configured to initiate in-situ leakage current testing. Processor 155 is also configured to determine leakage current, e.g., based on multiple OCV data points over time, which may be referred to as an OCV profile or an OCV function, e.g., OCV(t). For example, battery pack controller 150 is configured to obtain two or more OCV values from first battery cell 114 while the external cell current is discontinued through first battery cell 114 thereby determining the leakage current of first battery cell 114.

For example, processor 155 may utilize a lookup table in memory 151 to correlate OCV values with SOC values and then determine the leakage current based on the states of SOC values over time. As noted above, a loss of 1% SOC per month for 100 Ah cell corresponds to a virtual constant leakage current of about 1.4 mA. In some examples, processor 155 is also configured to determine an operating mode for a battery cell, e.g., based on the leakage current results. For example, processor 155 may instruct a corresponding node controller to disconnect the cell (e.g., after a slow discharge at less than 0.1 C) if the leakage current result exceeds a certain threshold (e.g., a safety threshold). Various other functions of processor 155 are described below with reference to various operations of the method in FIG. 2B.

In some examples, battery pack controller 150 comprises input/output (I/O) module 156 to communicate with each node controller in battery pack 100, battery pack sensors 180, and/or external systems (external to battery pack 100). For example, battery pack 100 may be a part of a larger system, such as an electric vehicle, grid-attached or off-grid energy storage system, and others as described above with reference to FIG. 1A. In the examples, I/O module 156 is configured to communicate with a battery data system, described above, to deliver test data, retrieve test protocols, and/or obtain new operating protocols.

In some examples, battery pack controller 150 is configured to proportionately or disproportionately distribute the pack power output among different nodes. This power distribution may be based on state of health and/or state of safety parameters from this system, model parameters learned from other systems, and other parameters. Furthermore, in some examples, battery pack controller 150 is configured to perform hazardous failure detection. For example, a high leakage current may be an indication of internal shorts. Some causes of internal shorts include, but are not limited to, (a) unintended conductive particles that penetrate the separator and short the positive and negative electrodes and (b) growth of metallic dendrites (e.g. lithium, copper) from the negative electrode piercing through the separator. High leakage current may be also an indication of the plating of metallic lithium on the surface of the negative electrode that causes an increase in the rate of electrolyte reduction. In some examples, a high leakage current may be an indication of an overcharge condition that causes an increase of the rate of electrolyte oxidation at the surface of the positive electrode and/or over-temperature conditions that cause an increase of the rates of electrolyte oxidation at the surface of the positive electrode and electrolyte reduction at the negative electrode. This higher-rate electrolyte oxidation is partly due to the Arrhenius law governing chemical reactions and partly due to the decomposition of the pre-existing passivation layers at certain elevated temperatures. Some other examples of hazardous conditions, which may be evident based on an increase of leakage current include, but are not limited to, physical damage to the cell (e.g., puncture, crushing) and external shorts, due to the presence of foreign conductive matter between the external tabs of the cells or anywhere along the electrical network connected to the cell. For example, severe shorts can be directly evident from a significant increase in the leakage current of the cell, relative to other cells. These shorts can generally be determined at any SOC. Other degradation and safety deterioration mechanisms may be less evident. For example, machine learning algorithms may be used, e.g., trained on fleet-wide cell leakage data to determine various types of degradation mechanisms.

In some examples, battery pack controller 150 is configured to perform cell degradation analysis. This analysis may involve an estimate of the leakage current (or a rate of self-discharge) by monitoring the evolution of the cell voltage under open-circuit conditions over a period of time. Estimates of leakage current exceeding a preset threshold or qualifying as an outlier (e.g., based on the histogram of comparable cells) provide various indications of cell degradation.

Examples of Global Data Analysis

Figure 2A:
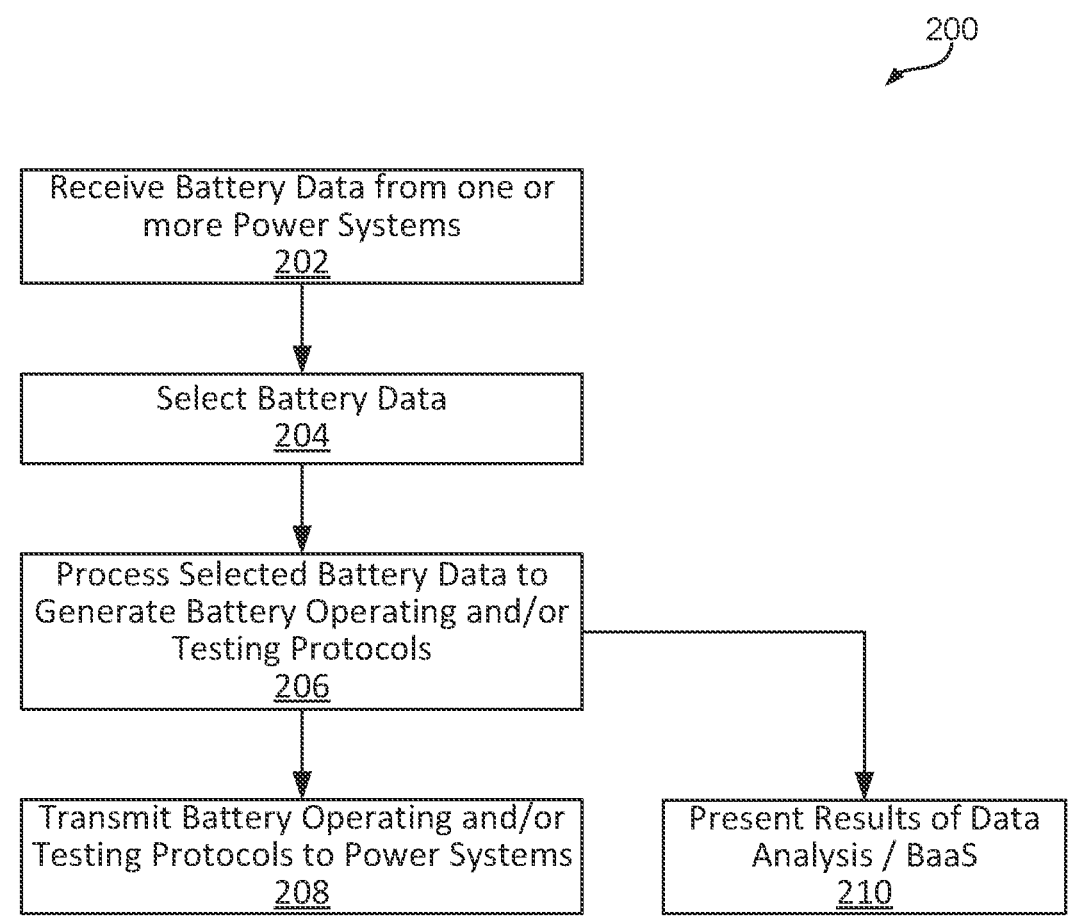
FIG. 2A is a process flowchart corresponding to a method for collecting and analyzing battery data from multiple power systems and developing new battery operating procedures and/or new battery testing protocols for these power systems, in accordance with some examples.

FIG. 2A is a process flowchart corresponding to method 200, representing various examples of global battery data analysis. This global battery data analysis may be performed by battery data system 102 or, more specifically, by battery data processing engine 105, various examples of which are described above with reference to FIG. 1A. The global battery data analysis is performed, for example, in addition to or instead of a local battery data analysis at a battery pack level (e.g., performed by a battery pack controller). In some examples, the results of battery pack controller analysis (e.g., the leakage current is determined using a battery pack controller based on OCV changes over time) are supplied to battery data system 102 as battery data for further processing.

In some examples, method 200 comprises receiving (block 202) battery data from one or more power systems. Some examples of the battery data include, but are not limited to, leakage current, temperature, operating parameters and history (e.g., several charge-discharge cycles, cut off voltages, SOCs, and charge/discharge rates) and others. The battery data corresponds to specific battery nodes (e.g., based on the identification of each node) and, in some examples, is separated into sets (e.g., each set corresponding to one node). For example, each node may have unique identification in battery ecosystem 103. The battery data may be encrypted, compressed, and/or other preprocessed (e.g., identifying various degradation mechanisms) before transmitting from the power systems to battery data system 102. For example, the received battery data comprises various determinations made at the battery pack level, such as state of health, state of power, and/or state of safety. This battery data may represent different power systems, different battery packs, and different battery cells. In some examples, the battery data may represent the same type of cells (e.g., cells having the same design) or different types of cells. The selection of different data sets, representing different battery nodes, (e.g., for aggregate analysis, benchmarking, and/or comparison) and/or data sets, representing the same battery node but at different test times, is performed at battery data system 102. For example, leakage current data from a set of different size cells may be compared to determine the effect of the cell size on self-discharge characteristics. In some examples, battery manufacturers produce multiple cell designs (e.g., an 11-Ah cell and a 55-Ah cell) using the same type of cell components (e.g., electrodes, electrolytes). The knowledge derived from one cell type may be relevant to another cell type. In some examples, battery data is received as a continuous stream of semi-structured data.

In some examples, power system 101 is configured for wired/wireless transfer (e.g., secure communication channels) of battery data to a battery data system. Power system 101 or, more specifically, each battery node may have a unique identifier (UID), which may be a vehicle identification number for electrical vehicles (EVs). Furthermore, power system 101 may include an application programming interface (API) key for identity authentication. When power system 101 is connected to battery data system 102, power system 101 uploads structured data (e.g., adhering to a schema, such as tabulated or SQL database) or unstructured data (e.g., records pairs). In some examples, battery data is aggregated into an array form. More specifically, the data may be aggregated based on a node id and/or sorted by chronological order. In some examples, a subset of the most recent data (e.g., last week, last month) is selected for trend analysis. The battery data is stored in battery data store 104, which may be a database, specifically configured for the battery data.

In some examples, method 200 comprises selecting (block 204) the battery data received from different power systems, e.g., based on the cell type, temperature, age, SOC, battery application (e.g., grid, residential, EV), and other like parameters. For example, battery data from different nodes or even different power systems may be used to compensate for differences among cells and provide for meaningful comparison. This operation may involve various data sorting algorithms.

In some examples, method 200 comprises processing (block 206) the selected battery data to determine degradation and safety deterioration mechanisms and/or generate battery operating protocols, future battery testing protocols, and other like protocols. Determining degradation and safety deterioration mechanisms based on leakage current data is described elsewhere in this document. Global battery data helps with finding data trends and/or applying various predictive models to anticipate degradation before any corresponding failures occur and to utilize various preemptive measures to avoid these failures and/or degradation. For example, a cell with an increased leakage current may be switched to an operating protocol with cell-preserving operating parameters (e.g., smaller charge/discharge currents, different cut off voltages, and others).

In some examples, self-learning methodologies (e.g., machine-learning, deep-learning, or even multi-modal machine-learning) are applied to process the data and, more specifically, to develop new battery testing protocols and/or to revise previous test protocols. For example, initial leakage current data may be used to identify an initial degradation mechanism, which is verified using a revised test. One example of this feedback-loop testing is adaptive charging, where voltage data, current data, temperature data, and/or other data is collected at different charging schema (e.g., fast charging of 10C vs. normal charging of 1C).

In some examples, processing the selected battery data involves an outlier detection scheme. One specific example involves a numeric outlier technique, e.g., a numeric value beyond Q3+k*IQR, where "IQR" represents the interquartile range, "Q3" represents the third quartile, and "k" represents interquartile multiplier value. Another example of outlier detection is a Z-score technique, which assumes a Gaussian distribution of the battery data with the outliers positioned in the tails of the distribution. For example, the distribution of leakage currents may be used, as measured within a battery pack, a subset of a battery pack, a power system, or multiple power systems.

In some examples, data processing involves one or more of business intelligence dashboards (e.g., corresponding to product usage trends and patterns), operational monitoring (e.g., identifying cell degradation mechanisms), anomaly detection (e.g., variations in battery data), embedded analytics (e.g., providing operators of power systems various access to data and reports), and data science (e.g., advanced analytics and machine learning for predictive testing and maintenance of battery packs, development of new test and operating protocols, artificial intelligence (AI) development).

In some examples, method 200 comprises transmitting (block 208) the battery operating protocols and/or battery testing protocols to different power systems. The selection of power systems (for new protocol) may be based on information available to battery data system 102 about these power systems. Some examples of this information include, but are not limited to, types of cells, sizes and/or architectures of battery packs, previous test data, and others.

For example, the operation of multiple EVs generates data for each cell in these EVs. For context, a typical 10-100 kWh battery pack used for EVs may include hundreds or even thousands of individual cells. Many EVs are operated using different operating parameters (e.g., charge/discharge rates, SOCs, temperatures). As such, individual cell data from multiple EVs frequently collected over long periods (e.g., EV operating lifetime) can be easily characterized as "big data" or, more specifically, "big battery cell data." Raw data corresponding to individual cells for multiple EVs is aggregated and processed by battery data system 102, which may be also referred to as a "cloud". This data is processed to evaluate degradation and safety deterioration mechanisms and, in some examples, combined with user profiles (e.g., vehicle identification numbers, owners of EVs). Based on these determined degradation mechanisms, battery management settings are determined for each use profile of battery pack 100. Some examples of the raw data include, but are not limited to, leakage currents, exposed temperatures, temperature responses to power take in or take out, SOCs, charge/discharge rates, impedance, resistances, capacitances, magnetic fields distribution, and time. In some examples, leakage currents are presented as a function of temperature, SOC, and time as well as degradation and safety deterioration mechanisms when preprocessed in the system level. For example, during this data analysis, lithium plating is detected for a certain user profile associated with a high performance (e.g., high charge/discharge currents) but a smaller used range defined by the SOC. Based on this degradation mechanism, battery pack 100 is instructed to use lower cut off voltages for the suspect batteries, to operate in low impedance regimes, and/or to manage the cutoff voltages based on the cell temperature (e.g., reduce an upper cut off voltages at low temperatures to mitigate further lithium plating).

Furthermore, individual cell data (from multiple EVs) provides higher statistical accuracy than, for example, data available at the EV level or just a few test cells. In some examples, this big battery cell data is used to generate more precise maintenance requirements or lifetime predictions of the individual EVs, battery packs, and even individual cells. Self-learning cloud-based processing is used, for example, to improve individual battery pack management. In some examples, this battery pack is customized for each user and may involve independent management of each cell in a battery pack. Furthermore, this big battery cell data may be used to improve the manufacturing of battery cells and/or battery packs. For example, a first cell generation is used in an EV fleet, for which the big battery cell data is collected. Based on the global analysis of this data, a second cell generation is developed. Additional developments of battery cycles with these feedback loops are within the scope.

In some examples, cell data collected from a fleet of EVs (e.g., corresponding to a specific make-model) allows for faster data processing and real-time battery management of these EVs. For example, cell data may be used for a prediction of range, charge requirement for the next trip (e.g., full charging, partial charging, charging in a certain cut off voltage range), and power requirements, all of which may be more precise than currently available. For example, an upcoming trip is short but requires lots of power (e.g., driving up a steep hill or at highway speeds). In this example, the battery pack of this particular EV is charged to a certain SOC while the power and efficiency are optimized during the utilization of this power. In another example, a degradation mechanism, identified in one or more EVs, is used to update operating parameters of battery packs of the entire EV fleet.

In some examples, individual cell data is collected from multiple stationary storage systems. This cell data is processed in the cloud to determine various degradation mechanisms. Based on these degradation mechanisms, battery management is updated. For example, a specific system is used to achieve high power peaks without requiring a large storage capacity. If a lithium plating is detected in this system (e.g., based on an increase of leakage currents), the operating mode of this system may be updated to use lower cut off voltages (than before). Furthermore, the system may be operated in low impedance regimes. In some examples, the cut off voltage used for the operation of this system may be temperature-dependent (e.g., reducing upper cut off voltages at lower temperatures to mitigate further lithium plating).

In some examples, a stationary battery system is used for power storage from a solar array or a wind farm. In these examples, the analysis of individual cell data is combined with the weather forecast (e.g., sunlight intensity and duration, wind speed), charge requirement to satisfy energy profile for an upcoming next period (e.g., full charging, partial charging, charging in a certain cut off voltage range), and/or power requirement.

In some examples, method 200 involves presenting results of the data analysis (block 210) to one or more users in battery ecosystem 103. These users may be power system manufacturers, power system owners, and/or third parties (e.g., researchers). For example, battery data system 102 may provide a user interface for controllably accessing, retrieving, managing, and/or analyzing the battery data. In some examples, battery data system 102 is configured to manage the battery data ownership and/or data accessibility.

Examples of In-Situ Leakage Current Testing

Figure 2B:
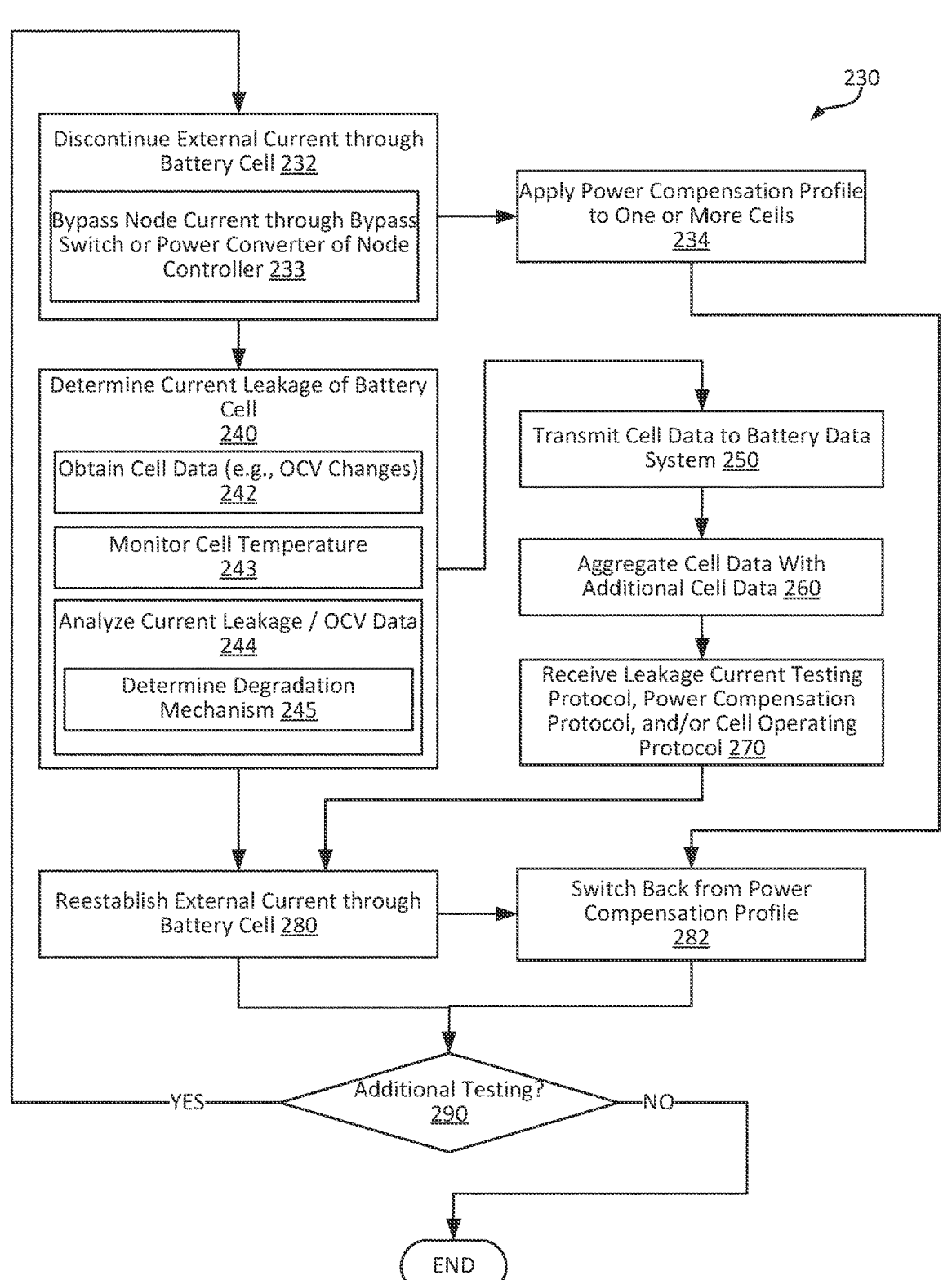
FIG. 2B is a process flowchart corresponding to a method for an in-situ leakage current testing of battery cells in a battery pack, in accordance with some examples.

FIG. 2B is a process flowchart corresponding to method 230 for in-situ leakage current testing of battery cells in battery pack 100, in accordance with some examples. Various details and examples of battery pack 100 are described above with reference to FIGS. 1B-1E.

In some examples, method 230 comprises discontinuing (block 232) the external current through at least first battery cell 114. The external current may be also referred to as a current cell ($I_{Cell1}$=0) and should be distinguished from the node current and the leakage current. In other words, first battery cell 114 is taken offline and no longer contributes to the power output of battery pack 100. In more specific examples, multiple battery cells are taken offline at the same time for simultaneous leakage current testing. For example, FIG. 1C illustrates two battery cells connected in series (battery cell 114a and battery cell 114b) and disconnecting the external current through one of these cells will also cause the same disconnecting the external current through the other cell. Overall, multiple battery cells, which are simultaneously taken offline, maybe a part of the same node and/or different nodes. The number of battery cells, which can be simultaneously taken offline, depends on the current power output of battery pack 100, SOC of the cells, and other like factors.

The operation represented by block 232 is performed while battery pack 100 remains operational and, in more specific examples, while battery pack 100 provides power output (such being discharged or charged). In other words, battery pack 100 remains online, while first battery cell 114 is taken offline. Specifically, at least one other battery cell of battery pack 100 continues to charge or discharge, contributing to the power output of battery pack 100 while first battery cell 114 remains offline.

In some examples, the external current through first battery cell 114 is discontinued using first node controller 112, e.g., one or more switched of first node controller 112. More specifically, first node controller 112 performs this operation based on instructions received from battery pack controller 150.

In some examples, first node controller 112 may comprise a bypass switch (e.g., as a standalone component or as a part of a power converter). In these examples, discontinuing (block 232) the external cell current through first battery cell 114 comprising bypassing (block 233) a node current through a bypass switch or a power converter of first node controller 112 as further described below with reference to FIGS. 2C-2E.

Some examples of the trigger for this operation (represented by block 232) include, but are not limited to, an age/calendar time (e.g., time since cells have been manufactured), cycle count, and previous operating parameters and history (e.g., exposure to a high/low temperature, subjecting to a charge/discharge current) of either first battery cell 114 and/or of battery pack 100. For example, a battery cell may be brought offline and tested weekly and/or after every 50-100 cycles (since the last test). In the same or other examples, another trigger is on the SOC of first battery cell 114, e.g., the SOC of at least 70%, at least 80%, at least 90%, or even at least 95%. A particular SOC threshold or range is used, for example, to detect a specific degradation mechanism, to have some charge available when the state is brought back online, and other reasons. For example, the leakage current may be more evident at a higher SOC. Overall, discontinuing the external cell current through first battery cell 114 is performed when the SOC of first battery cell 114 is within a predetermined range, various examples of which listed above. Various methods of measuring or estimating the SOC of first battery cell 114 are within the scope, e.g., based on a measured voltage (e.g., an OCV or under a given load) of first battery cell 114.

In some examples, the cell temperature may be used as a condition and/or as a trigger. For example, leakage current testing is initiated when the cell reaches a certain temperature, which may be referred to as a test temperature. As described below, the temperature is a major factor affecting leakage current in battery cells. Therefore, a specific test temperature may be needed to ensure meaningful leakage-current data. It should be noted that once the cell is taken offline, the test temperature depends on the temperature of surrounding components (e.g., other cells, a thermal management system of battery pack 100, and the ambient environment) and the heat transfer between the cell and these surrounding components. In some examples, the temperature of these surrounding components may be controlled and/or predicted (e.g., from historical data). In some examples, an elevated (e.g., greater than 40° C.) temperature is used for faster testing. Furthermore, at elevated temperatures, the surrounding cells will have a higher power output capability for power balancing and, potentially, enabling testing more cells at the same time.

Some illustrative examples include, but are not limited to: (a) after a brief or prolonged exposure to a high ambient temperature (e.g. >40° C.) or a high internal cell temperature (high current), leakage current testing is scheduled to detect damaged passivation layers; (b) after a charging event under low-temperature conditions (e.g. <10° C.), leakage current testing is scheduled to detect lithium plating; (c) after a change in other measurable battery parameters (e.g., impedance, pressure) obtained by other monitoring techniques, leakage current testing is scheduled to detect physical damage (e.g. crushing) or electrical fault.

In some examples, the operation represented by block 232 is initiated based on input received by battery pack 100 from battery data system 102, communicatively coupled to battery pack 100. For example, battery data system 102 provides a trigger point and/or a battery test protocol to battery pack 100 or, more specifically, to battery pack controller 150, which initiates method 230 based on this battery test protocol. This trigger may be generated based on battery data obtain from other battery cells, e.g., which are similar to the tested battery cell of battery pack 100.

Overall, a starting time for discontinuing the external cell current through first battery cell 114 may be determined based on at least one of the operating history of first battery cell 114, the operating history of battery pack 100, the testing history of first battery cell 114, the testing history of battery pack 100, the SOC of first battery cell 114, the SOC of the battery pack (100), the temperature of first battery cell 114, the OCV of first battery cell 114, the voltage of first battery cell 114 under a given load, and/or a test data analysis of battery cells equivalent to the first battery cell 114. For example, the test data analysis or, more specifically, a test protocol, developed based on this test data analysis may be received by battery pack 100 from battery data system 102. Battery pack controller 150 then uses this test data analysis/test protocol to trigger the leakage current testing of first battery cell 114 and/or other cells of battery pack 100.

Figure 2D:
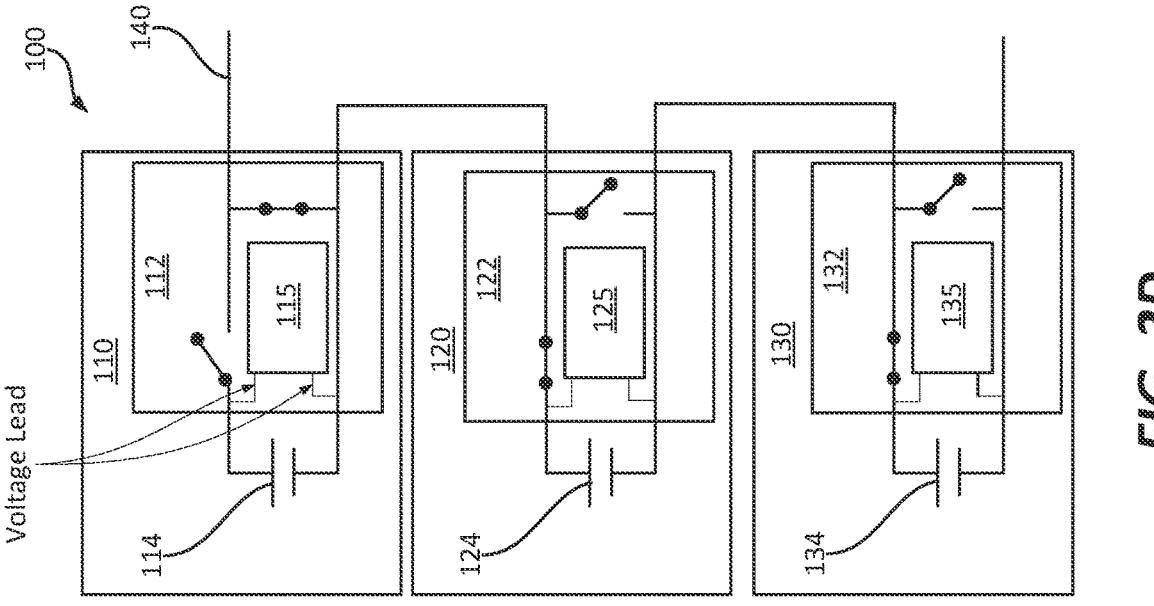
FIGS. 2C-2E are schematic block diagrams illustrating different examples of a battery pack while testing a first battery cell for leakage current.
Figure 2C:
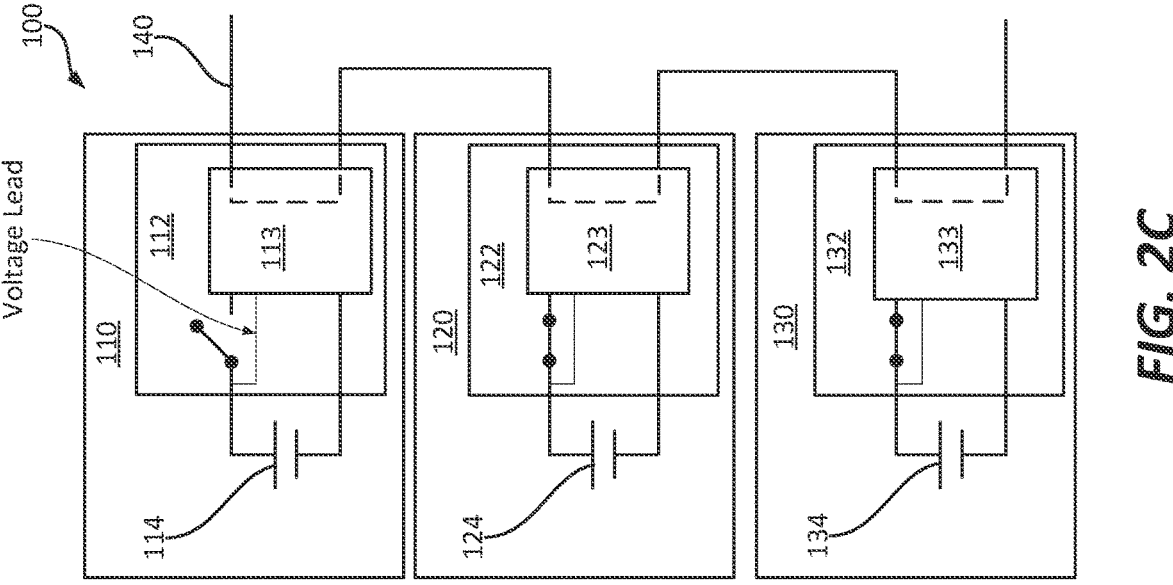
Figure 2E:
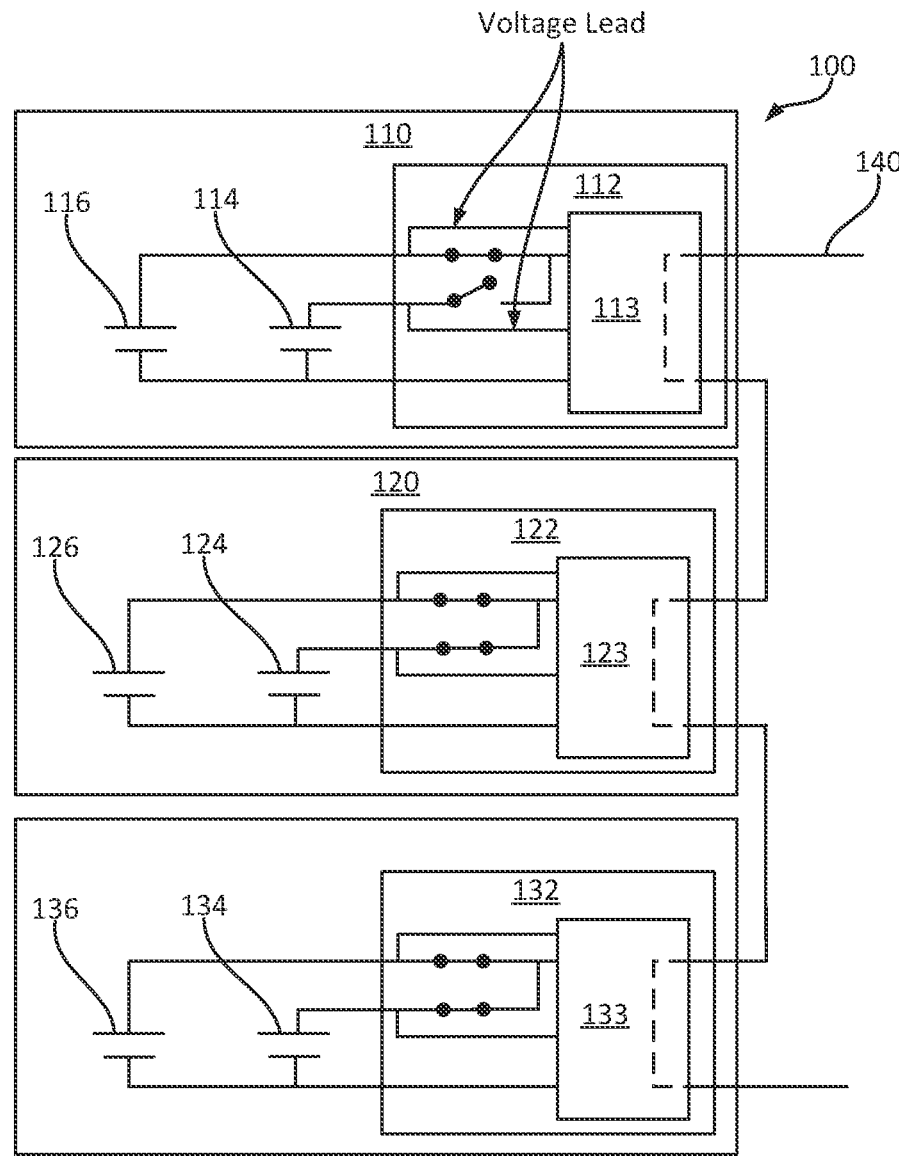

FIGS. 2C-2E are schematic block diagrams illustrating different examples of battery pack 100, while testing first battery cell 114 for leakage current. Specifically, FIG. 2C and FIG. 2D illustrate examples where each node controller comprises a power converter, selectively connected to each cell of that node and also to bus 140. In FIG. 2C, each node has only one cell, e.g., first battery node 110 comprises first battery cell 114, second battery node 120 comprises second battery cell 124, third battery node 130 comprises third battery cell 134. When the external cell is disconnected through first battery cell 114, e.g., using a switch of first node controller 112, the bus/pack current passes through first power converter 113 of first node controller 112. First power converter 113 or other components of first node controller 112 can measure voltage of first battery cell 114 through voltage leads. In some examples, these voltage leads may be used to pass a test current to first battery cell 114 (e.g., to maintain first battery cell 114 at the constant SOC while measuring the leakage current, corresponding to the test current). Continuing with the example in FIG. 2C, the power connection is retained between second battery cell 124 and second power converter 123 as well as between third battery cell 134 and third power converter 133. In other words, the external current through second battery cell 124 and through third battery cell 134 may be different than the bus current, due to step-up or step-down conversion provided by each of second power converter 123 and third power converter 133. Furthermore, one or both of second battery cell 124 and through third battery cell 134 may be used for power compensation when first battery cell 114 is taken offline for leakage testing.

Referring to FIG. 2D, each node also has only one cell, but the nodes do not have power converters. Instead, each node has a voltmeter, such as first voltmeter 115 of first node controller 112, second voltmeter 125 of second node controller 122, and third voltmeter 135 of third battery node controller 132. First voltmeter 115 is coupled (e.g., by voltage leads) to first battery cell 114 and can measure the voltage across first battery cell 114 regardless of the connection of first battery cell 114 to bus 140. For example, FIG. 2D illustrates a state of battery pack 100, in which first battery cell 114 is disconnected from bus 140. The bus current still passes through first battery node 110 and first node controller 112 using, e.g., a bypass switch. It should be noted that battery pack 100 remains operational when first battery cell 114 is disconnected from bus 140 and the bus current is bypassed through first node controller 112. The voltage across the three nodes may decrease, but an external battery inverter may provide compensation for this decrease. In second battery node 120 and third battery node 130, the bypass switch is open while each of second battery cell 124 and third battery cell 134 is connected to bus 140 and the external/bus current passes through these cells.

Referring to FIG. 2E, each node has two cells, similar to FIG. 1B described above. For example, first battery node 110 comprises first battery cell 114 and additional first battery cell 116, each independently connectable to first power converter 113 of first node controller 112. Specifically, FIG. 2E illustrates first battery cell 114 not having a power connection to first power converter 113 (the corresponding switch is open). However, first power converter 113 or some other component of first node controller 112 is configured to monitor the voltage across first battery cell 114 even in this disconnected state. Additional first battery cell 116 has a power connection to first power converter 113 (the corresponding switch is closed), and the external current passes through additional first battery cell 116. Both of second battery cell 124 and additional second battery cell 126 of second battery node 120 have power connections to second power converter 123 of second node controller 122. As such, external currents pass through second battery cell 124 and additional second battery cell 126, which may be the same or different. Similarly, both of third battery cell 134 and additional third battery cell 136 of third battery node 130 have power connections to third power converter 133 of third node controller 132. As such, external currents pass through third battery cell 134 and additional third battery cell 136, which may be the same or different. In this example, the power compensation (due to disconnecting first battery cell 114 for the leakage current testing) may be provided by various combinations of the remaining cells.

During this operation, the node current continues to flow through first node controller 112 as well as other node controllers (e.g., second node controller 122), which are connected in series with first node controller 112. At the same time, power conversion stage 162 turns on its internal bus-side FET continuously, thereby providing a path for the bus current to flow through power conversion stage 162 or, more generally, through the node controller.

Furthermore, in some examples, the pack voltage across (e.g., between first pack terminal 141 and second pack terminal 142 shown in FIG. 1B) remains substantially unchanged while the cell current through first battery cell 114 is discontinued. More specifically, the voltage of battery pack 100 remains substantially unchanged based on the power compensation provided by one or more additional cells in battery pack 100. Furthermore, in some examples, the power output of battery pack 100 during this operation (taking first battery cell 114 offline) remains substantially unchanged. For purposes of this disclosure, the term "substantially unchanged" means that the value of a parameter remains within the operating or allowable voltage range of load/supply 190, connected to battery pack 100. In some examples, the term "substantially unchanged" means that the change is less than 10%, less than 5%, less than 2% or even less than 1%. In general, one having ordinary skill in the art would understand the term "substantially unchanged" based on the specific configuration and/or application of battery pack 100.

Specifically, the pack voltage remains unchanged by operating one or more other battery cells in battery pack 100 according to a power compensation profile. The power compensation profile may be generated by battery pack controller 150 (e.g., before testing first battery cell 114). In some examples, the power compensation dynamically changes (e.g., revised by battery pack controller 150) based, e.g., on the overall power demand of battery pack 100, state of other cells in battery pack 100, and other like factors. More specifically, the power compensation profile is applied (block 234) to one or more battery cells in the same node (as first battery cell 114) and/or different nodes. Various power compensation profiles and examples will now be described with reference to FIGS. 3A-3C. Overall, the power compensation may be provided by battery cells of first battery node 110 and/or other battery nodes. The selection of the nodes and cells for this power compensation depends on the power output of battery pack 100, SOC of battery cells, and/or other like factors.

Overview of Outlier Detection

Figure 3:
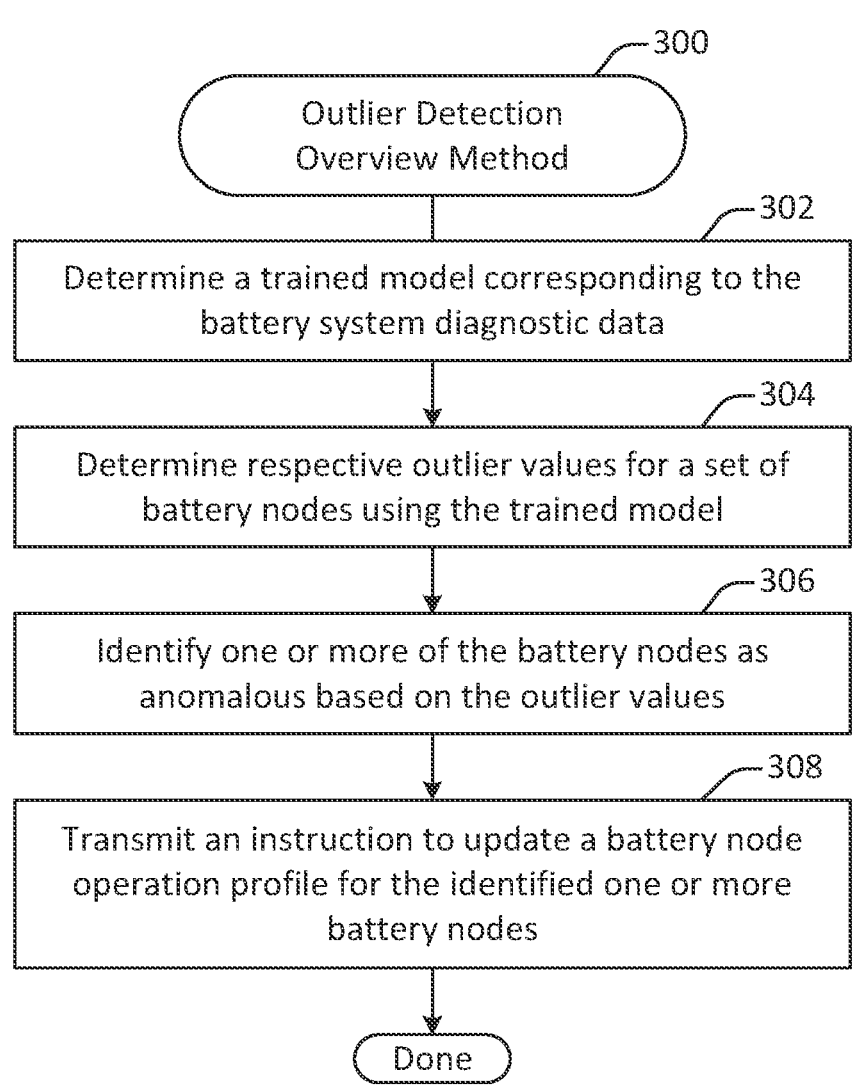
FIG. 3 illustrates a method for operating a battery ecosystem, performed in accordance with one or more embodiments.

FIG. 3 illustrates a method 300 for operating a battery ecosystem, performed in accordance with one or more embodiments. The method 300 may be performed at one or more elements within a battery ecosystem, such as the battery data processing engine 105 and/or the battery pack controller 150. Additional details regarding the interaction between a battery pack 100, a battery pack controller 150, and a battery data processing engine 105 are discussed throughout the application, for instance with respect to FIG. 4.

At 302, a trained model is determined. In some implementations, the trained model may be dynamically determined based on the input data alone, and need not be pre-trained. Alternatively, in some embodiments, a model that is at least partially pre-trained may be used. For instance, default weights in a neural network may be employed.

According to various embodiments, any of a variety of models may be used. For example, the trained model may be, or include, a variational autoencoder, generative adversarial neural network, or other type of neural network. In such configurations, the neural network may include an input layer receiving battery system diagnostic data. The neural network may also include an output layer corresponding to the battery system diagnostic data. As another example, the trained model may be a diffusion model that maps to a latent space using a Markov chain. As yet another example, the trained model may be or included a clustering approach. In such an approach, features may be extracted from raw data and used to perform cluster.

At 304, respective outlier values are determined for a set of battery nodes using the trained model. In some embodiments, an outlier value may indicate a degree to which a node or group of nodes deviates from its peers along one or more dimensions. An outlier value may be determined by providing to the trained model input data corresponding to a battery node. According to various embodiments, outlier values may be constructed in any of a variety of ways, depending on the type of model employed.

In some embodiments, an outlier value may be a reconstruction error value. For instance, if a variational autoencoder is employed, the trained model may be used to produce a set of output values corresponding to the input values. The output values may be compared with the input values to determine the reconstruction error, which may be used as the outlier value. Alternatively, or additionally, an outlier value may be determined based on deviation from one or more clusters after applying a clustering algorithm. For instance, the outlier value may be implemented as a distance from the nearest cluster according to a distance metric. Additional details regarding the training of an outlier detection model and the determination of outlier values are discussed throughout the application, for instance with respect to FIG. 9.

One or more of the battery nodes are identified as anomalous at 306 based on the outlier values. In some embodiments, a battery node may be identified as anomalous by comparing its outlier value to the mean outlier value for the population of battery nodes, in light of the standard deviation of the outlier values. If the difference between the battery node's outlier value and the population outlier value is statistically significant according to some threshold, then the battery node may be deemed anomalous. Additional details regarding the identification of a battery node as anomalous are discussed throughout the application, for instance with respect to FIG. 10.

An instruction to update a battery node operation profile for the identified one or more battery nodes is transmitted at 308. According to various embodiments, a battery node identified as anomalous may be decoupled from a power bus and effectively deactivated. Alternatively, an anomalous battery node may be placed in another type of operation profile, such as a diagnostic, prognosis, or mitigation profile. Additional details regarding the placement of a battery node in a battery node operation profile are discussed throughout the application, for instance with respect to FIG. 5, FIG. 6, and FIG. 7.

Examples of Battery Pack Operation Profiles

Figure 4:
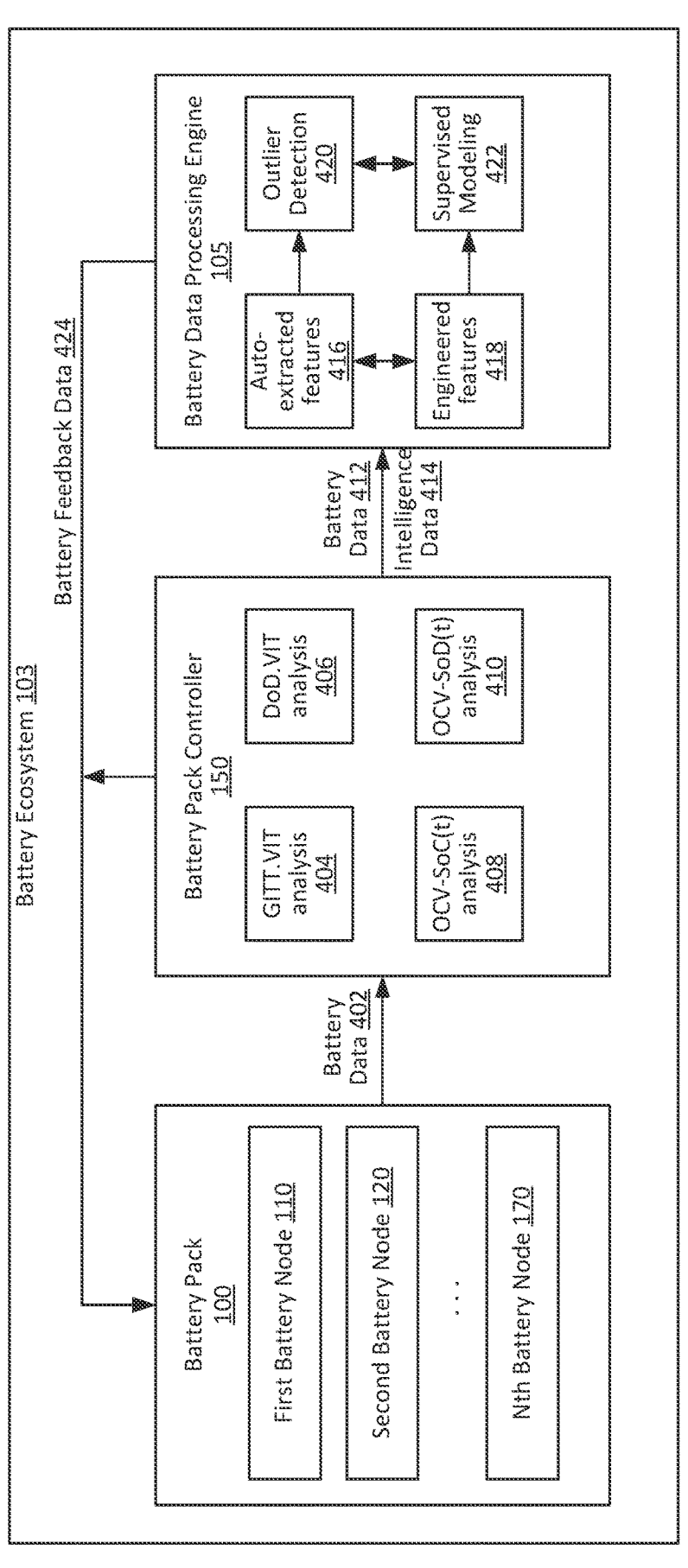
FIG. 4 illustrates an additional schematic block diagram of the battery ecosystem, configured in accordance with one or more embodiments.

FIG. 4 illustrates an additional schematic block diagram of the battery ecosystem 103, configured in accordance with one or more embodiments. The battery ecosystem 103 includes the battery pack 100, the battery pack controller 150, and the battery data processing engine 105. The view of the battery ecosystem 103 presented in FIG. 4 includes particular elements for the purpose of illustration. However, as discussed herein, for instance with respect to FIG. 1A, the battery ecosystem 103 may include other elements not shown in FIG. 4.

The battery pack 100 includes potentially many different battery nodes, including the first battery node 110, the second battery node 120, and the Nth battery node 170. As discussed herein, each battery node may be placed in a particular profile by a node controller within the battery node. According to various embodiments, the profile assigned to a battery node may affect characteristics such as the speed and/or voltage pattern with which the battery node is charged and/or discharged.

In some embodiments, a battery node may be placed in a regular profile, during which it is charging and/or discharging current. When the battery node is placed in a regular profile, it may be operated in series with one or more other battery nodes.

In some embodiments, a battery node may be placed in a diagnostic state, during which one or more battery cells are subjected to a current pattern designed to elicit information about the one or more battery cells. Then, one or more sensors may detect information about the one or more battery cells over time, such as voltage, current, and/or temperature data.

In some embodiments, a battery node may be placed in a mitigation profile. When the battery node is placed in the mitigation state, the battery node may be exposed to less stress than when placed in a regular profile. For example, one or more restrictions may be placed on the speed at which the battery node may be charged and/or discharged. When the battery node is placed in the mitigation profile, it may be disconnected from one or more other battery nodes so that it may be operated in a more protected fashion.

According to various embodiments, battery data 402 may be collected from a battery node placed in any of a variety of operation profiles. The battery data 402 may be collected via one or more sensors such as the sensors 180 shown in FIG. 1B. Alternatively, or additionally, battery data may include information determined based on the battery profile associated with a node, such as the voltage and/or current supplied to one or more battery cells at particular points in time. Data collected for battery nodes may be aggregated at the battery pack controller 150.

According to various embodiments, the battery pack controller 150 may include one or more processors, such as an embedded processor within the battery pack. The battery pack controller 150 may be configured to analyze the battery data 402 to produce battery intelligence data 402.

In some embodiments, the battery pack controller 150 may be configured to determine any of a variety of types of analysis. For example, the battery pack controller 150 may be configured to determine OCV state of charge data over time 408 for a battery node. As another example, the battery pack controller 150 may be configured to determine OCV state of discharge data over time 410 for a battery node. As yet another example, the battery pack controller 150 may be configured to determine galvanostatic intermittent titration technique (GITT) data 404 by performing a GITT test. As still another example, the battery pack controller 150 may be configured to determine depth of discharge (DoD) data 406.

In some implementations, the battery pack controller 150 may be configured to determine prognosis data for battery nodes based on the battery data and the processed intelligence from the battery data, referred to herein as "the intelligence data" 414. Determining the prognosis data may involve, for instance, predicting future characteristics of a battery node and determining a course of action. Such characteristics may include, but are not limited to: state of safety, state of degradation, state of charge, and/or other aspects of battery node performance and/or health. In particular embodiments, prognosis data may include a prediction as to whether and when a battery node will fail.

In some embodiments, the battery pack controller 150 may be configured to change the profile assigned to a battery node based on the prognosis data based on one or more rules or thresholds. For example, when the battery pack controller 150 determines a prediction that a risk of imminent failure for a particular battery node exceeds a designated threshold, then the battery pack controller 150 may place that battery node in a mitigation state in which charging and/or discharging of the battery node is restricted or halted. As another example, when the battery pack controller 150 detects unusual data for a battery node operating in a regular profile, the battery pack controller 150 may place the battery node in a diagnostic profile to elicit data under more controlled circumstances. Techniques for battery node anomaly detection are discussed in additional details with respect to FIG. 9, FIG. 10, FIG. 11, and FIG. 12.

In particular embodiments, a battery controller 150 may be include more than one level of hardware and/or analysis. For example, a battery pack controller may aggregate data and perform analysis for a set of battery nodes, while an array-level controller may aggregate data and perform analysis for a set of battery packs.

The battery pack controller provides data to the battery data processing engine 105, including battery data 412 and/or intelligence data 414. The battery data processing engine 105 may be located remotely from the battery pack controller 150. For instance, the battery pack controller 150 may be located at the battery, while the battery data processing engine 105 may be located in a remote computing system such as a cloud computing environment. Hence, the battery pack controller may provide data to the battery data processing engine 105 via a network such as the internet, potentially while the battery pack is in active use.

In some embodiments, the battery pack controller 150 may provide data to the battery data processing engine 105 at scheduled times. For instance, the battery pack controller 150 may provide data once per minute, or at some other time interval. Alternatively, or additionally, the battery pack controller 150 may provide data when a triggering condition is detected, such as one or more battery nodes at the battery system being identified as anomalous.

In some implementations, the intelligence data 414 may include any of the data discussed with respect to elements 404, 406, 408, and 410. Alternatively, or additionally, the intelligence data 414 may include other types of information, such as prognosis data, data about battery node profiles in place at particular times, other types of analysis, and/or any other suitable information determined by the battery pack controller 150.

According to various embodiments, the data provided by the battery pack controller 150 to the battery data processing engine 105 may include battery data 412. The battery data 412 may include some or all of the battery data 402 received at the battery pack controller 150. The battery data 412 and/or intelligence data 414 may be implemented as time-series data sets that each include multiple features. Each feature may be associated with a particular battery node, and may have different values for the battery node at different points in time. For instance, a particular battery node may be associated with a voltage value collected at a temporal resolution of once per every 10 milliseconds.

In some embodiments, the battery data 412 may be a selected or compressed version of the battery data 402. For example, the battery data 412 may include fewer features than the battery data 402. As another example, the battery data 412 may be aggregated at a lower level of temporal resolution than the battery data 402.

According to various embodiments, a wide range of temporal resolutions may be selected for transmitting battery data 412 and/or intelligence data 414. For instance, data may be generated with an adaptive temporal resolution of milliseconds, tens of milliseconds, seconds, tens of seconds, or any other suitable temporal resolution.

In some implementations, the temporal resolution at which data is transmitted may be varied for the battery system as a whole. Alternatively, or additionally, the temporal resolution may be altered for portions of the battery system, such as one or more battery nodes, battery packs, or other units of analysis.

According to various embodiments, employing an adaptive temporal resolution may allow for reducing the volume of data transmitted in some situations, while providing for comprehensive data in other situations. For example, a less granular temporal resolution may be used when the system or a portion of the system seems to be operating normally, while a more granular temporal resolution may be used when a potential problem has been detected. As another example, a less granular temporal resolution may be used when the communication link between the battery pack controller 150 and the battery data processing engine 105 exhibits lower bandwidth, while a more granular temporal resolution may be used when bandwidth availability permits.

In some embodiments, the battery data 412 and/or the intelligence data 414 may be subjected to one or more pre-processing steps, either at the battery pack controller, the battery data processing engine 105, or both. Such pre-processing may involve, for instance, seasonality reduction. Seasonality reduction may reduce variation in the battery data associated with seasonal variation such as time of day, charging state, and the like.

In some embodiments, the battery data processing engine 105 may be configured to perform various types of analysis on the battery data 412 and/or the intelligence data 414. For example, the battery data processing engine 105 may be configured to perform automatic feature extraction at 416. Automatic feature extraction may involve deep networks or other processes for quickly extracting features from the data without human intervention. As another example, the battery data processing engine 105 may be configured to extract engineered features 416 from the battery data 412 and/or the intelligence data 414. The engineered features 416 may be extracted based on one or more rules and/or criteria specified in configuration information. The automatically extracted features may be used to detect outliers among the battery nodes via an outlier detection system at 420. The engineered features 418 may be used to perform supervised modeling at a supervised modeling system 422.

According to various embodiments, the outlier detection system may include any of a variety of machine learning techniques. For instance, the outlier detection system may be configured to apply an unsupervised variational auto-encoder to detect outliers.

In some embodiments, the outlier detection system 402 may be unsupervised rather than pre-trained on data from other battery systems because different battery systems may exhibit very different characteristics, even if they include seemingly identical hardware and/or software elements. The outlier detection system 402 may be unsupervised rather than pre-trained on data from the battery pack 100 in order to detect potential problems even when the battery pack is not yet associated with historical data.

In some embodiments, the outlier detection system 402 may be used to identify which if any of the battery nodes is exhibiting characteristics that are markedly different from other battery nodes during a particular period of time, irrespective of any historical data. However, as historical data becomes available, the historical data may be used to inform the analysis of the outlier detection system 420. For example, one or more engineered features included in the supervised modeling 402 may be included in the outlier detection system. As another example, a battery node identified by the supervised modeling system 402 as anomalous may be excluded from one or more aspects of unsupervised modeling.

According to various embodiments, the supervised modeling system 422 is configured to perform supervised machine learning analysis on the battery data 412 and/or the intelligence data 414. The supervised machine learning analysis may receive as input one or more engineered features determined based on configuration information that specifies how to select and/or pre-process information in the battery data 412 and/or the intelligence data 414 for analysis.

Battery feedback data 424 may be provided from the battery data processing engine 105 to the battery pack 100. The battery feedback data 424 may include any of a variety of types of information. In some embodiments, the battery feedback data 424 may identify one or more nodes predicted to fail by the supervised modeling system 422. Alternatively, or additionally, the battery feedback data 424 may identify one or more nodes identified as anomalous by the outlier detection system 420.

In some implementations, the battery feedback data 424 may include one or more profiles for application to one or more nodes in the battery pack 100. For instance, the battery feedback data 424 may identify one or more nodes for being placed in a mitigation profile, a diagnostic profile, a prognosis profile, and/or a regular profile. In particular embodiments, the battery feedback data 424 may include one or more customized profiles designed to elicit particular types of data from a battery node, for instance to facilitate further analysis.

In some embodiments, the battery feedback data 424 may include one or more battery pack operation modes for application to the battery pack 100. According to various embodiments, a battery pack operation mode may identify a set of profiles to apply to the battery pack nodes, in parallel and/or in sequence. Additional details regarding battery pack operation modes are discussed throughout the application, for instance with respect to FIG. 5, FIG. 6, and FIG. 7.

According to various embodiments, a supervised modeling system 422 may provide more accurate predictions than the outlier detection system 420. However, the outlier detection system 420 may be superior at operating without historical data and at detecting novel conditions that are not reflected in the training data used to train one or more supervised machine learning models in the supervised modeling system 422.

In some embodiments, the supervised modeling system 422 may include one or more supervised machine learning models trained based on historical data. The historical data may include one or more actual instances of battery node failure associated with the battery pack 100. However, it is desirable to avoid such failures whenever possible. Indeed, many such failures may be avoided based on proactive instructions sent to the battery pack based on prognosis data determined by the battery pack controller 150 and/or outlier detection data determined by the outlier detection system 420. Accordingly, incidents of actual battery node failure may be limited, providing limited opportunity for training a supervised model to predict battery node failure. Thus, alternatively or additionally, outcome data may be determined based on the intelligence data 414 and/or the outlier detection system 420.

In some embodiments, a battery node identified as anomalous by the outlier detection system 420 may be used to train the supervised modeling system 422. For instance, engineered feature data may be determined based on the same input data used to auto-extract features for the outlier detection system 420. Then, battery nodes identified as anomalous may be treated as failed nodes for the purpose of supervised modeling, while other battery nodes may be treated as good nodes for the purpose of supervised modeling. Collectively this data may be used as a training data set for training a supervised machine learning model to predict battery nodes likely to fail. Moreover, the training data set may continue to grow as new data is collected and provided to the outlier detection system 420.

Figure 5:
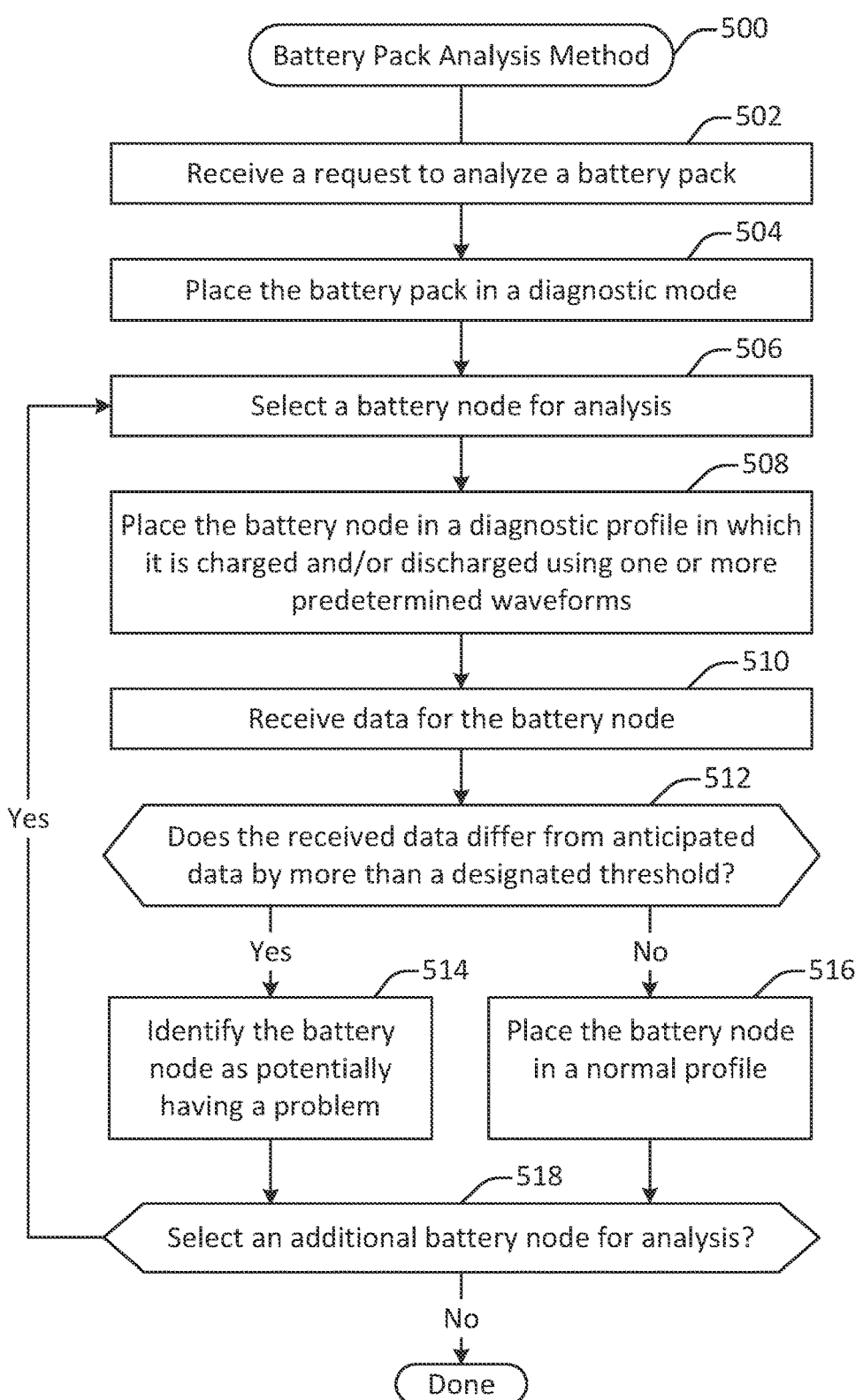
FIG. 5 illustrates a battery pack analysis method, performed in accordance with one or more embodiments.

FIG. 5 illustrates a battery pack analysis method 500, performed in accordance with one or more embodiments. The battery pack control method 500 will be described with reference to FIG. 7, which illustrates a state diagram showing an example of an arrangements of elements in a battery ecosystem, configured in accordance with one or more embodiments.

Figure 7:
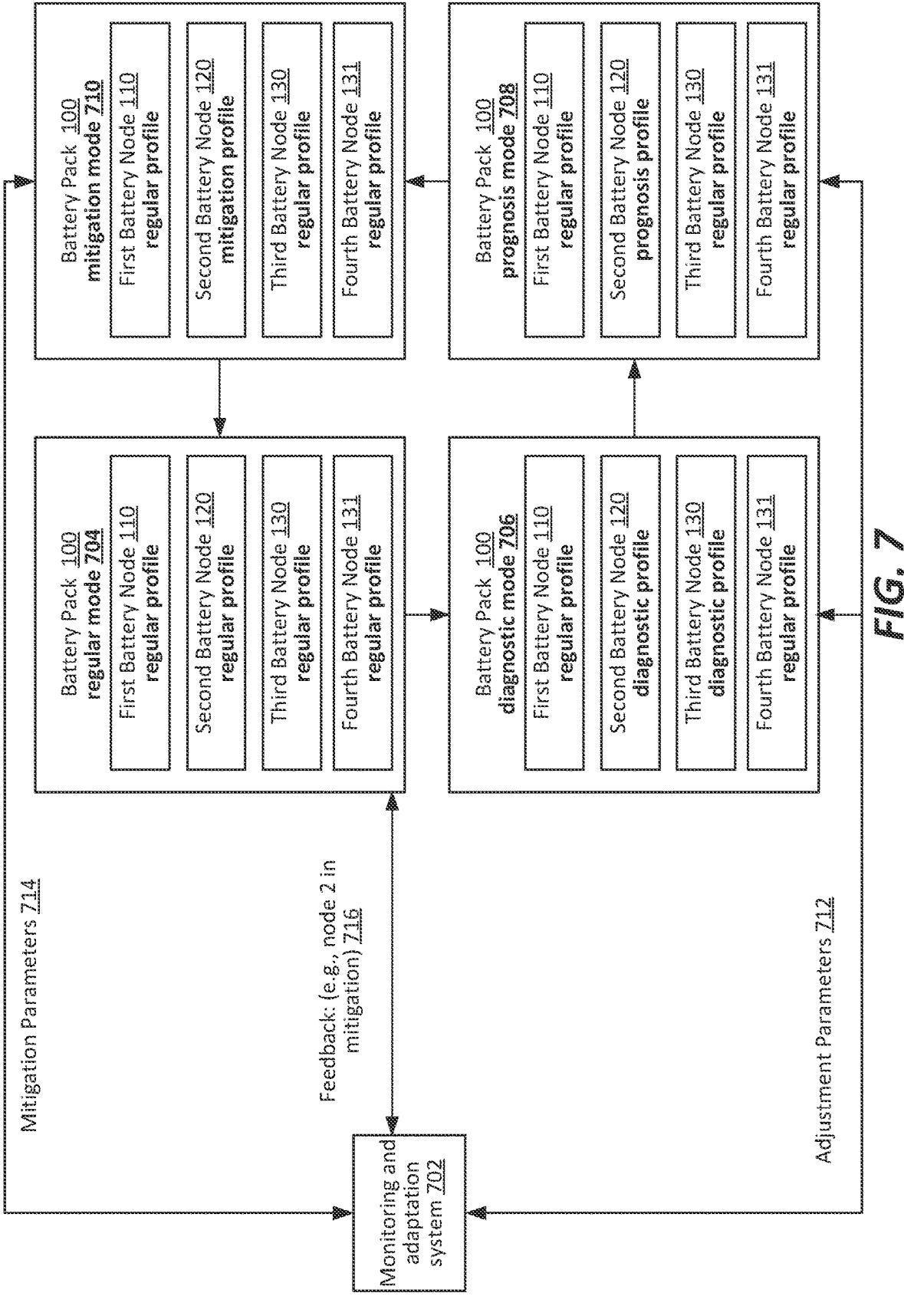
FIG. 7 illustrates a state diagram showing an example of an arrangements of elements in a battery ecosystem, configured in accordance with one or more embodiments.

The battery pack control method 500 may be performed at one or more components of the battery ecosystem 103. In FIG. 7, the battery pack 100 is in communication with a monitoring and adaptation system 702. According to various embodiments, the monitoring an adaptation system 702 may include one or more systems or elements discussed herein, such as the battery pack controller 150 and/or the battery data processing engine 105. As discussed with respect to FIG. 3, both the battery pack controller 150 and the battery data processing engine 105 may receive information and generate intelligence and instructions related to the operation of a battery pack.

Initially, the battery pack may be operating in a regular mode. The battery pack 100 is shown in FIG. 7 as operating in a regular mode at 704. According to various embodiments, the regular mode may be a normal state of operation for the battery pack 100. In the regular mode, each battery node in the battery pack may be operating in a regular profile in which it is charging and/or discharging normally under specified operation conditions.

Returning to FIG. 5, a request to analyze a battery pack by placing the battery pack in a diagnostic mode is received at 502. According to various embodiments, any of a variety of triggering conditions may cause the battery pack 100 to be placed in a diagnostic mode. For example, the battery pack 100 may be placed in a diagnostic mode at scheduled times, for instance to perform regular analysis of the battery nodes in the battery pack. As another example, the battery pack 100 may be placed in a diagnostic mode when it is determined that diagnostic mode is unlikely to significantly affect performance of the battery pack 100. As yet another example, the battery pack 100 may be placed in a prognostic mode when a potential problem is detected. For instance, a potential problem may manifest as an unanticipated change in voltage and/or temperature.

The battery pack is placed in a diagnostic mode at 504. At 706, the battery pack 100 is moved to a diagnostic mode. In some embodiments, the battery pack 100 may be moved to a diagnostic mode based on information received from the battery pack controller 150. Alternatively, or additionally, the battery pack 100 may be moved to a diagnostic mode based on information received from the battery data processing engine 105.

A battery node is selected for analysis at 506. Battery nodes may be selected for diagnostic mode in sequence, in parallel, or in any suitable order.

The battery node is placed in a diagnostic profile at 508, and data for the battery node is received at 510. In some embodiments, when the battery pack is placed in a diagnostic mode, one or more of the nodes in the battery pack may be placed in a diagnostic profile to elicit data about the battery nodes under controlled conditions. When in the diagnostic profile, the battery node is charged and/or discharged using one or more predetermined waveforms. Then, data about the battery node such as voltage, temperature, current, and other such information is collected.

After data for the battery node is received, the data may be analyzed at 512 to determine if it differs from anticipated data by more than a designated threshold. If a significant difference exists, then the battery node is identified at 514 as anomalous. For instance, a particular waveform may tend to result in a particular current if a battery node is functioning normally. If the current detected is different from what is anticipated, the battery node may be identified as anomalous. When a battery node is identified as anomalous, it may be kept in a diagnostic profile, returned to a normal profile, or moved to a different profile, such as prognosis.

After the analysis, the battery node is placed in a normal profile at 516 if it is not anomalous. According to various embodiments, placing the battery node into a normal profile may involve resuming normal charging and discharging operations without applying a predetermined waveform to the battery cell or cells in the battery node.

A determination is made at 518 as to whether to select an additional battery node for analysis. If it is determined to select an additional battery node for analysis, then an additional battery node is selected at 506.

In some embodiments, additional battery nodes may continue to be selected until all nodes have been analyzed. For example, the battery nodes may be placed in a diagnostic profile in a round robin format, so that each battery node is eventually placed in a diagnostic profile for a period of time while at any given time most of the battery nodes remain operating in a regular profile. In this way, the battery pack 100 can continue normal charging and discharging operations while in a diagnostic profile. Thus, although in FIG. 7 the second and third battery nodes 120 and 130 are shown in a diagnostic profile and the first and fourth battery nodes 110 and 131 are shown in a regular profile, this arrangement may change over time to allow some or all of the other battery nodes to be tested while at the same time permitting in situ charging and/or discharging of the battery pack 100. In some configurations, a greater proportion of battery nodes may be placed in a diagnostic profile when it is determined the battery is not in state in which fewer nodes are needed for charging and/or discharging.

Figure 6:
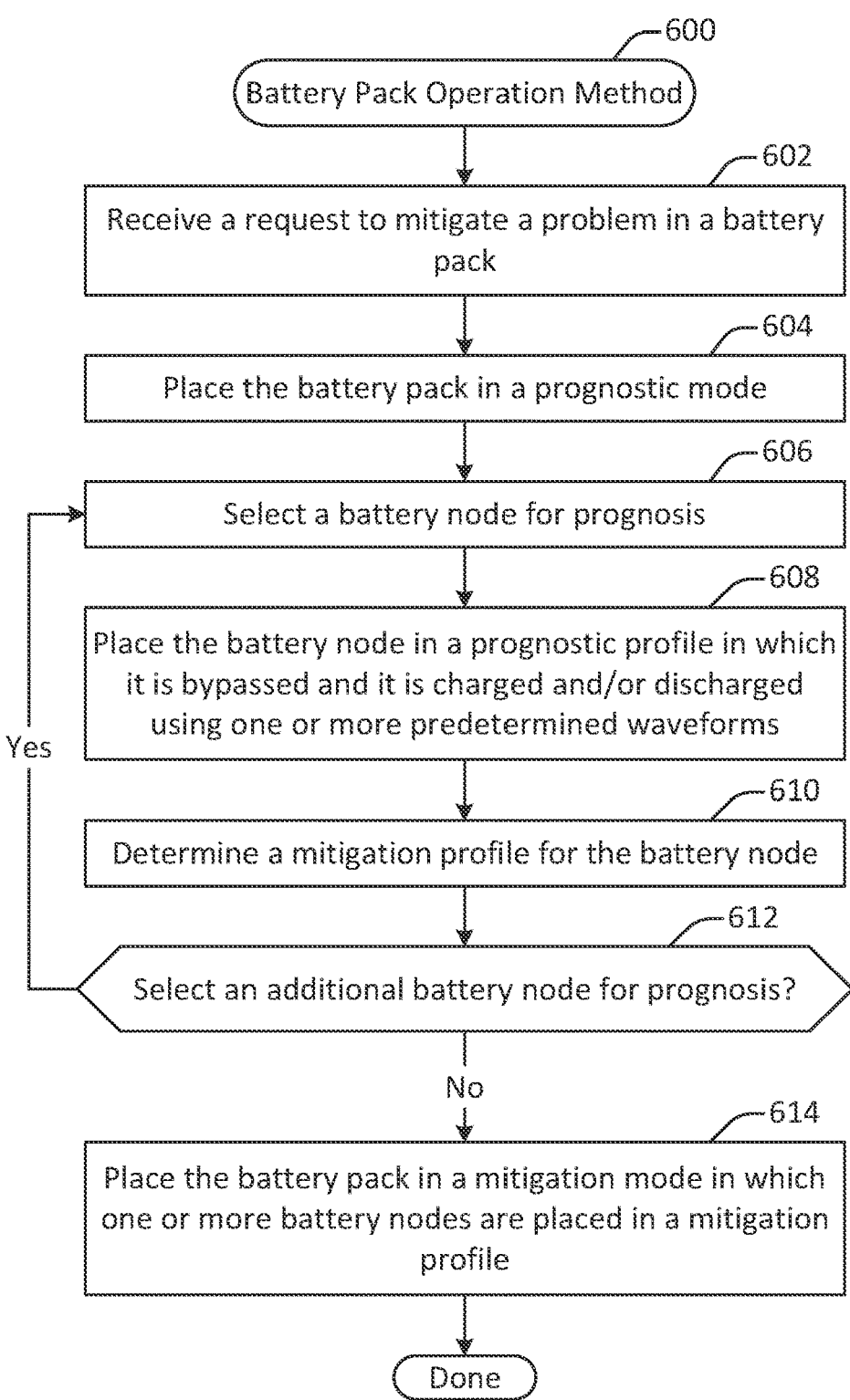
FIG. 6 illustrates a battery pack control method, performed in accordance with one or more embodiments.

FIG. 6 illustrates a battery pack mitigation method 600, performed in accordance with one or more embodiments. The battery pack mitigation method 600 may be performed if one or more battery nodes are identified in the method 500 as anomalous.

If a problem with one or more battery nodes has been detected, then at 604 the battery pack is placed in a prognostic mode. In FIG. 7, the battery pack 100 is transitioned to a prognosis mode at 708. The prognosis mode is employed because the diagnostic mode revealed determined that the second battery node 120 was anomalous.

Returning to FIG. 6, a battery node identified as anomalous is selected for prognosis at 606. The battery node is then placed in a prognostic profile at 608 in which it is bypassed. While bypassed, it is charged and/or discharged using one or more predetermined waveforms. For example, in FIG. 7, the second battery node 120 is placed in a prognosis profile in the prognosis mode 708 while the remaining battery nodes are placed in a regular profile.

According to various embodiments, while the battery pack 100 is in a diagnostic mode and/or a prognosis mode, the monitoring and adaptation system 702 may receive diagnostic and prognosis data from the battery pack 100. The monitoring and adaptation system 702 may then provide one or more adjustment parameters 712 to the battery pack 100. The one or more adjustment parameters may, for instance, fine-tune the profile of a battery node in order to elicit particular data.

In some embodiments, when a battery node is in a diagnostic profile, it may remain connected in serial with other battery nodes. In contrast, when a battery node is in a prognostic profile, it may be disconnected from the other battery nodes for isolation. While a battery node is bypassed in this way, it can be tested with highly precise stimulus and response. For instance, the second battery node may be tested with a range of charging and/or discharging stimulus to characterize the operation of the second battery node under a range of conditions.

Returning to FIG. 6, at 610 a mitigation profile is determined for the battery node identified as anomalous. If more than one battery node is identified as anomalous, then each battery node so identified may be associated with its own mitigation profile to reflect the particular characteristics of the battery node.

At 612, a determination is made as to whether to select an additional battery node for prognosis. According to various embodiments, battery nodes may be analyzed to determine mitigation profiles in sequence or in parallel.

If it is determined not to select an additional battery node for prognosis, then the battery pack is placed in a mitigation mode at 614 in which the battery node or nodes identified as anomalous are placed in a mitigation profile. For example, in FIG. 7, the battery pack 100 is placed in a mitigation mode at 710. When in a mitigation mode, the second battery node 120 is instructed to operating in a mitigation profile, while the other battery nodes are instructed to operate in a normal profile. In the mitigation profile, the second battery node is placed in a protected state in which its rate of charge and/or discharge is restricted in order to reduce the probability of failure. At the same time, the second battery node may be reconnected with the other battery nodes so that it can charge and discharge. The parameters needed for mitigation may be adaptively determined based on communication with the monitoring and adaptation system 702.

According to various embodiments, a battery node placed in a mitigation profile may over time return to normal operating conditions. Normal operating conditions may be detected by, for instance, occasionally placing the second battery node in a diagnostic profile. When it is determined that a battery node has returned to normal operating conditions, the battery node can be returned to a regular profile along with the other battery nodes. For example, in FIG. 7 the battery pack 110 is shown returning to a regular mode at 704. When the battery pack 100 is returned to the regular mode 704, the monitoring and adaptation system 702 may continue to collect data from the battery pack 100.

In some embodiments, the monitoring and adaptation system may generate feedback indicating the previous problem detected for the second battery node. Such feedback may be used to guide future actions. For instance, the second battery node 120 may be placed in a diagnostic mode more frequently than other battery nodes in order to better detect any subsequent problems.

According to various embodiments, one or more of the diagnostic profile, the prognosis profile, and/or the mitigation profile may involve subjecting a battery node to one or more predetermined current waveforms. A predetermined current waveform may be applied in order to generate a controlled situation in which the battery's operation may be observed.

According to various embodiments, the battery pack 100 need not go through the various modes shown and discussed in FIG. 5, FIG. 6, and FIG. 7 in the same sequence as that shown. For example, if no problems are detected in the diagnostic mode 706, then the battery pack may be returned to the regular mode 704 immediately, without needing to enter the prognosis mode 708 or the mitigation mode 710.

Figure 8:
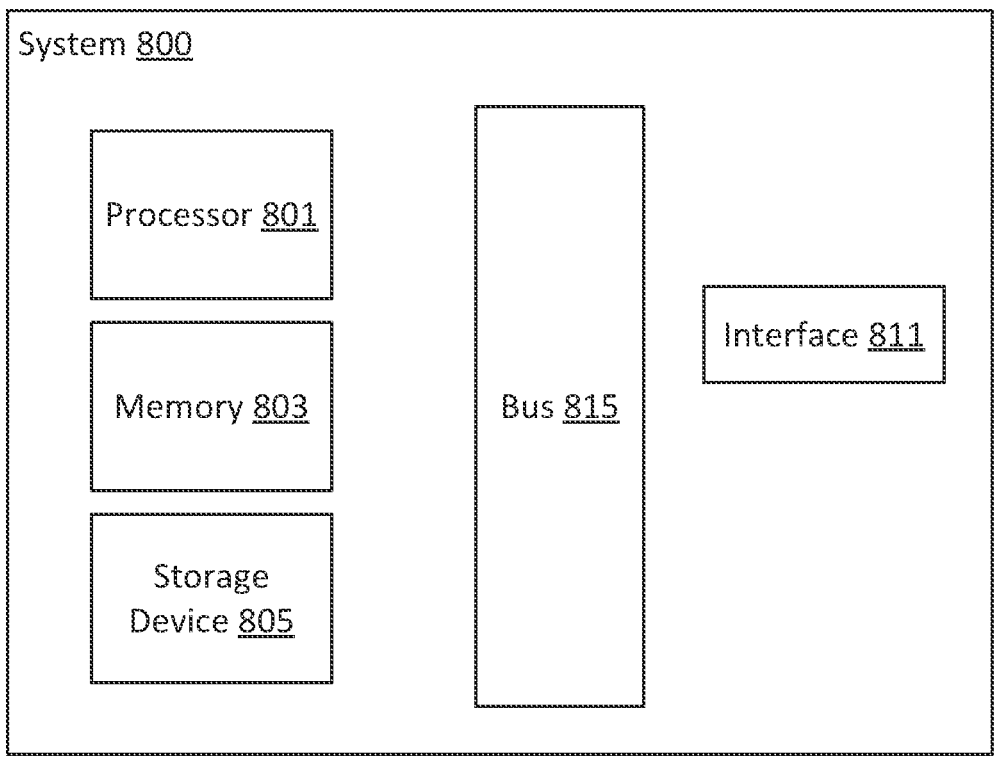
FIG. 8 illustrates one example of a computing device configured in accordance with one or more embodiments.

FIG. 8 illustrates one example of a computing device configured in accordance with one or more embodiments. According to various embodiments, a system 800 suitable for implementing embodiments described herein includes a processor 801, a memory module 803, a storage device 805, an interface 811, and a bus 815 (e.g., a PCI bus or other interconnection fabric.) System 800 may operate as variety of devices such as a battery data processing engine 105, a battery pack controller 150, or any other device or service described herein. Although a particular configuration is described, a variety of alternative configurations are possible. The processor 801 may perform operations such as those described herein. Instructions for performing such operations may be embodied in the memory 803, on one or more non-transitory computer readable media, or on some other storage device. Various specially configured devices can also be used in place of or in addition to the processor 801. The interface 811 may be configured to send and receive data packets over a network, and may include ports appropriate for communication with the appropriate media. An interface may also include an independent processor and/or volatile RAM. A computer system or computing device may include or communicate with a monitor, printer, or other suitable display for providing any of the results mentioned herein to a user.

Examples of Outlier Detection Techniques

Figure 9:
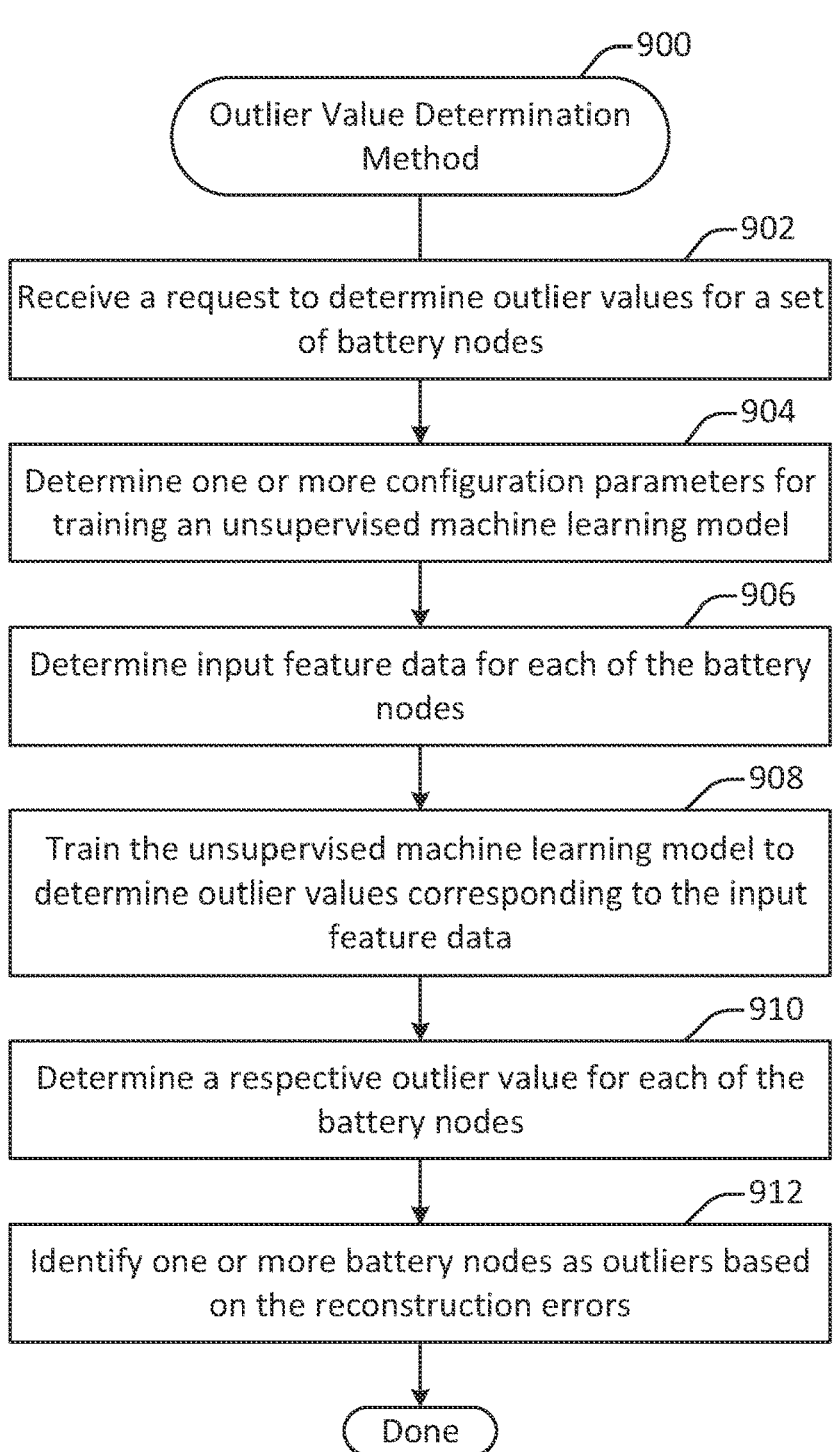
FIG. 9 illustrates a method for determining outlier values, performed in accordance with one or more embodiments.

FIG. 9 illustrates a method 900 for determining outlier values, performed in accordance with one or more embodiments. In some implementations, the method 900 may be performed at one or more elements within a battery ecosystem such as the battery ecosystem 103.

A request to determine outlier values for a set of battery nodes is received at 902. In some implementations, the request may be generated when a battery pack is placed into a diagnostic mode. When in the diagnostic mode, a variety of data related to battery nodes within the battery pack may be collected. Such data may include, but is not limited to, data on voltage, current, temperature, discharge rate, charge rate, and the like.

One or more configuration parameters for training an unsupervised machine learning model are determined at 904. According to various embodiments, any of a variety of unsupervised machine learning models may be used. For instance, unsupervised machine learning models suitable for use in determining battery node outlier values include variational autoencoders and generative adversarial networks, discussed in greater detail below.

According to various embodiments, the configuration parameters may be determined based on any of a variety of factors, such as the type of unsupervised machine learning model employed. One or more of the configuration parameters may be predetermined, for instance retrieved from configuration data stored within the battery data processing engine 105. Alternatively, or additionally, one or more of the configuration parameters may be determined based on information associated with the request received at 902. For instance, the number of neurons included in a latent space within the network may depend at least in part on the number of observations received.

In particular embodiments, one or more configuration parameters may be specified as a set or range of values. Then, the set or range of values may be used for hyperparameter tuning. Hyperparameter tuning may involve, for instance, running repeated iterations of the unsupervised machine learning model and tracking battery nodes identified as anomalous in different iterations. Suitable examples of hyperparameter tuning methods may include, but are not limited to: grid search, gradient-based, and Bayesian optimization. A battery node identified as anomalous may potentially be removed from the training set used to train the unsupervised machine learning model during successive iterations of the training phase, but be kept in the input data set during the determination of outlier values.

Input feature data for each of the battery nodes is determined at 906. According to various embodiments, determining the input feature data may involve performing feature selection on the available data. Any of a variety of feature selection techniques may be used, which may include, but are not limited to: principal component analysis, linear discriminant analysis, non-negative matrix factorization, generalized discriminant analysis. After feature selection is performed, data corresponding to each of the features may be determined for each of the battery nodes represented in the data set.

According to various embodiments, determining input feature data may involve performing one or more pre-processing operations. For instance, input data having various lengths may be truncated to fit within the same feature space. Alternatively, or additionally, input data may be normalized at any of a variety of levels, such as at the cell level, the battery node level, or the population level.

In some implementations, the data set may involve time series data in which multiple observations are available over time for a battery node. In such a situation, outlier values may be determined and analyzed at multiple points in time for a battery node. Alternatively, or additionally, data from multiple points in time may be aggregated to reduce the number of temporal observations for a battery node and to smooth out temporal variation in data values.

The unsupervised machine learning model is trained at 908 to generate output feature data corresponding to the input feature data. After the model is trained, a respective outlier value is determined at 910 for each of the battery nodes. According to various embodiments, the particular techniques used to train the unsupervised machine learning model may depend in part on the type of model being trained.

In some embodiments, a variational autoencoder may be used. A variational auto encoder may include a deep learning neural network that is trained to encode an input layer of neurons into a latent space layer of neurons, and then to decode the latent space layer of neurons into an output layer of neurons that matches the input layer of neurons. The model may be trained to produce values in the output layer of neurons that match as closely as possible corresponding values in the input layer of neurons. However, the latent space layer of neurons may have fewer neurons than both the input layer of neurons and the output layer of neurons. Hence, the variational autoencoder serves as a type of dimensionality reducer in which a battery node with a potentially large range of data values is represented in a latent space with many fewer dimensions, with the input values being reproduced as closely as possible in a subsequent decoding portion of the neural network.

In the case of a variational autoencoder, the reconstruction error for a battery node may be determined after the variational autoencoder is trained. For instance, the reconstruction error may be determined based on differences between the input data values for the battery node and the data values for the battery node output by the variational autoencoder. The reconstruction error may then be used as the outlier value.

In some embodiments, a generative adversarial network may be used. A generative adversarial network may include two models, a generative network and a discriminant network, trained to oppose one another in a zero-sum game. The generative network is trained to produce novel data observations that match as closely as possible the distribution of input data. At the same time, the discriminant phase is trained to distinguish between an actual data observation and a novel data observation created by the generative network.

In the case of a generative adversarial network, the reconstruction error for a battery node may be determined after the generative adversarial network is trained. For instance, the generative adversarial network may be determined based on the probability that the battery node represents a novel data observation as predicted by the discriminant network in the generative adversarial network. The reconstruction error may then be used as the outlier value.

In some embodiments, a clustering algorithm may be used. A clustering algorithm may position each data observation in a multi-dimensional space. For instance, dimensionality reduction may be used to identify a set of dimensions characterizing the battery node diagnostic data. Each observation may then be placed in a location in a multi-dimensional space defined by those dimensions and a distance metric. The observations may then be grouped into clusters within the multi-dimensional space. Suitable clustering algorithms may include, but are not limited to: k-means clustering, centroid-based clustering, density-based clustering, hierarchical clustering, distribution-based clustering, or any other applicable clustering approach. Suitable distance metrics may include, but are not limited to: Euclidean distance, Manhattan distance, Minkowski distance, Mahalanobis distance, and Hamming distance.

In the case of a clustering approach, a distance value along some measure of distance from a node to a cluster may be determined for each battery node. Suitable distance metrics may include, but are not limited to: Euclidean distance, Manhattan distance, Minkowski distance, Mahalanobis distance, and Hamming distance. The distance value may be determined between the location of the battery node observation in the multi-dimensional space and the mean, median, edge, and/or other region of the nearest cluster. The distance value may then be employed as the outlier value.

In some embodiments, a diffusion model may be employed. In a diffusion model, one or more Markov chains may be trained using variational inference to learn the latent structure of the dataset by modeling the way in which the observations corresponding to the battery nodes diffuse through the latent space. The diffusion model may be trained to generate non-anomalous observations. Then, for a given battery, a distance value may be determined from the observation to the learned representation. The distance value may be used as the outlier value.

One or more battery nodes are identified as outliers based on the outlier values at 912. Additional techniques for performing such identification are discussed throughout the application, and more specifically with respect to FIG. 10.

Figure 10:
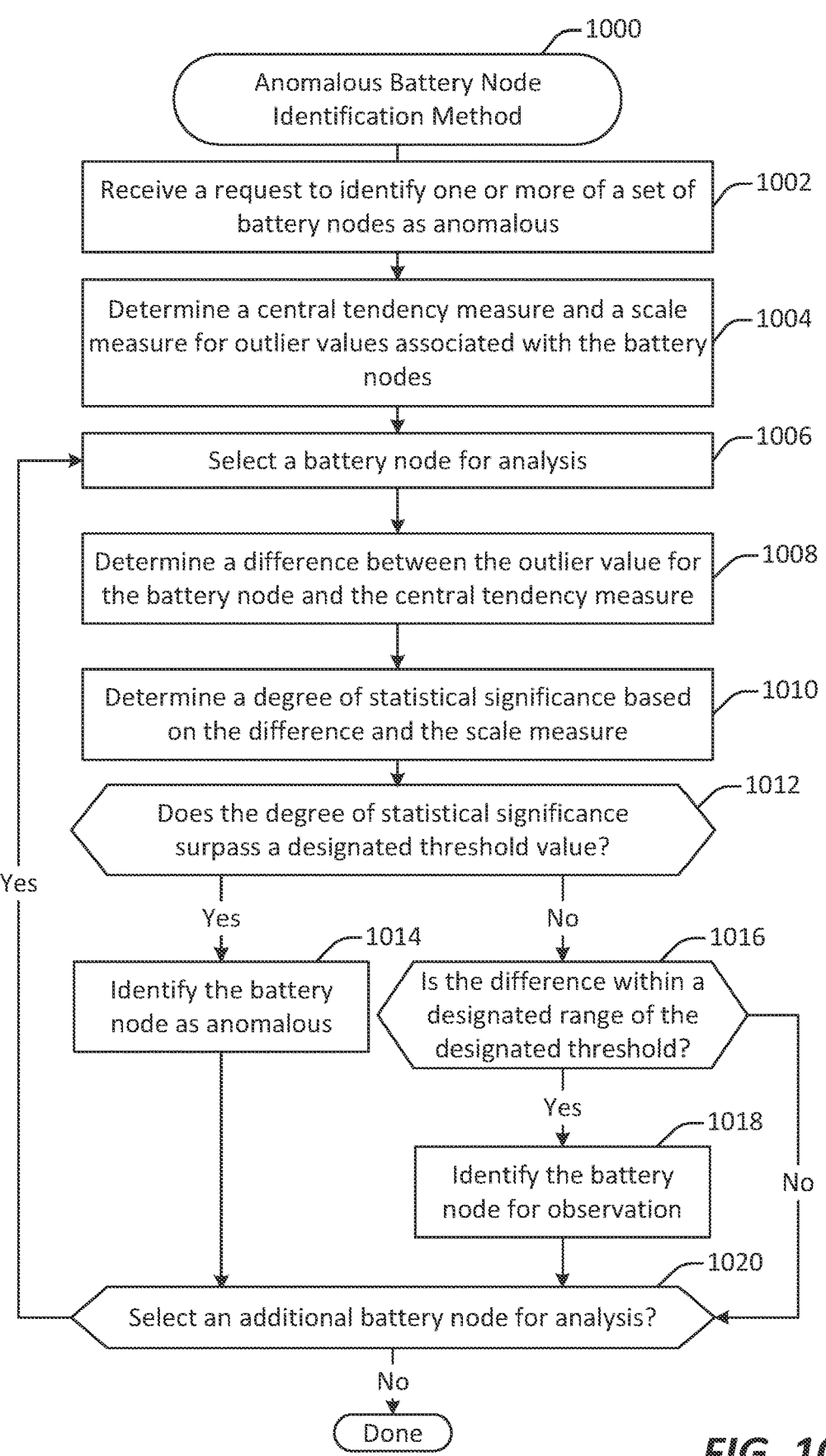
FIG. 10 illustrates a method of identifying one or more anomalous battery nodes, performed in accordance with one or more embodiments.

FIG. 10 illustrates a method 1000 of identifying one or more anomalous battery nodes, performed in accordance with one or more embodiments. In some implementations, the method 1000 may be performed at one or more elements within a battery ecosystem such as the battery ecosystem 103.

A request to identify one or more of a set of battery nodes as anomalous is received at 1002. In some embodiments, the request may be generated after outlier values are determined for the battery nodes. For instance, outlier values may be generated discussed with respect to the method 900 shown in FIG. 9.

A central tendency measure and a scale measure are determined at 1004 for the outlier values associated with the battery nodes. According to various embodiments, any of a variety of techniques may be used to determine the central tendency measure and the scale measure. For example, the central tendency measure may be a mean, while the scale measure may be a standard deviation. As another example, the central tendency measure and the scale measure may be determined via a bootstrap approach. As yet another example, the central tendency measure and the scale measure may be determined based on the Huber location and scale technique.

A battery node is selected for analysis at 1006. According to various embodiments, battery nodes may be analyzed in sequence, in parallel, or in any suitable order.

A difference between the outlier value for the battery node and the central tendency measure is determined at 1008. A degree of statistical significance based on the difference and the scale measure is determined at 1010. According to various embodiments, any of a variety of techniques may be employed to determine the degree of statistical significance. For instance, the degree of statistical significance may be determined as a p-value indicating a probability of generating an outlier value at least as extreme as the observed outlier value by a non-anomalous battery node.

A determination is made at 1012 as to whether the degree of statistical significance surpasses a designated threshold value. For instance, in the case of a p-value, a determination may be made as to whether the p-value falls below a threshold value of 0.001, a threshold value of 0.05, or any other suitable threshold value.

In particular embodiments, the designated threshold value may be determined based at least in part based on one or more configuration parameters. Alternatively, or additionally, the designated threshold value may be determined based at least in part on one or more characteristics of the battery pack. For instance, a larger set of input features may allow for setting a more stringent threshold value for the degree of statistical significance.

If it is determined that the degree of statistical significance does not surpass the designated threshold value, then at 1016 a determination is made as to whether the difference is within a designated range of the designated threshold value. According to various embodiments, the designated range may be determined in a manner similar to the designated threshold value. For instance, in the case of p-values, the designated range may be double the designated threshold values, or increased by some other predetermined multiplier.

Figure 11:
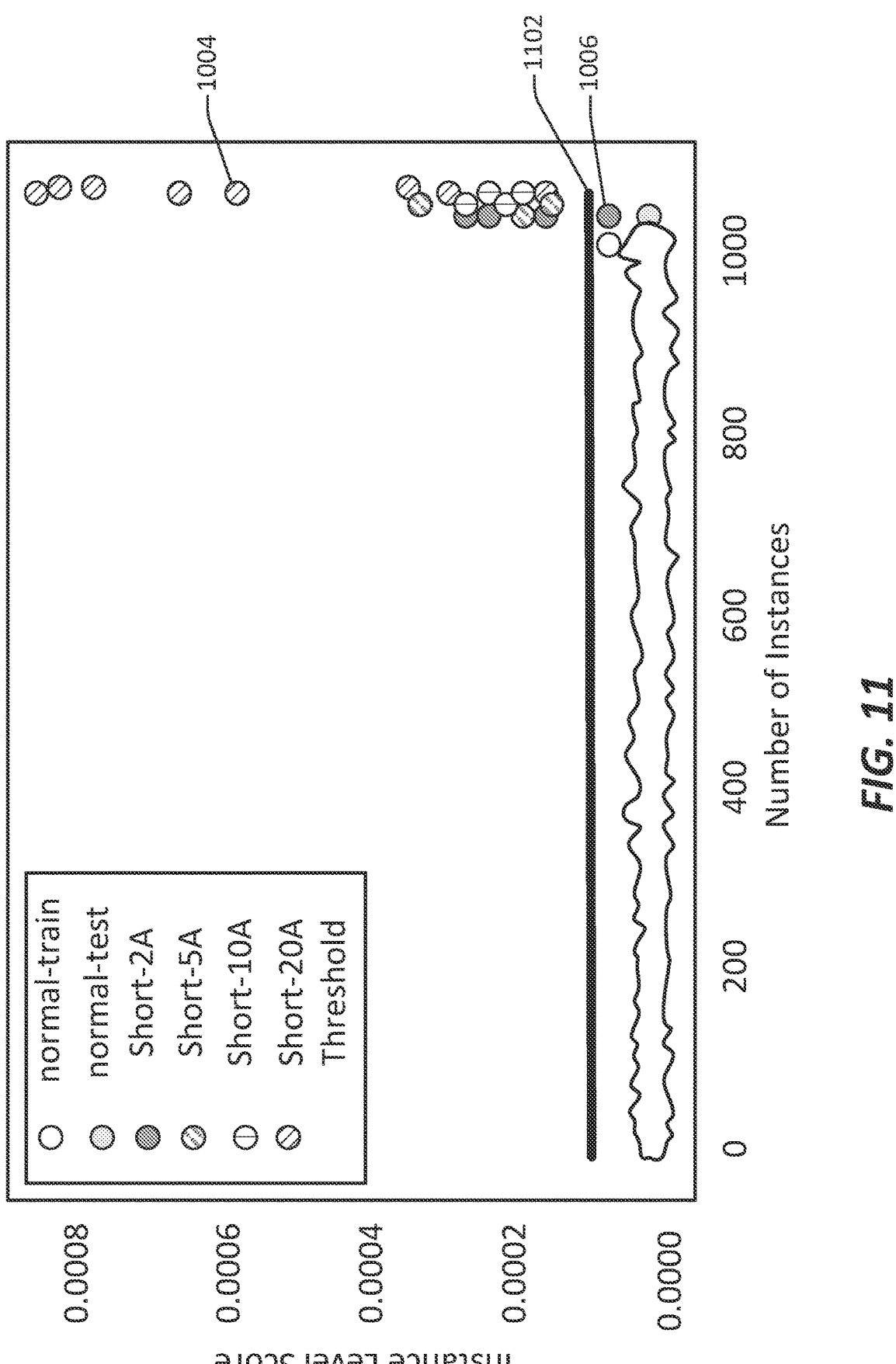
FIG. 11 illustrates a plot of outlier values for battery node instances, generated in accordance with one or more embodiments.

FIG. 11 illustrates a plot of outlier values for battery node instances, generated in accordance with one or more embodiments. A threshold value is shown at 1102. A data observation for a battery node having an outlier value with a degree of statistical significance surpassing the designated threshold value is shown at 1104. A data observation for a battery node having an outlier value with a degree of statistical significance within a designated range of the designated threshold value is shown at 1106. Battery nodes known to be anomalous are represented as empty circles, while battery nodes known not to be anomalous are represented as filled circles.

Returning to FIG. 10, if it is determined that the difference is within the designated threshold, then at 1014 the battery node is identified as anomalous. If it is instead determined that the difference is within the designated range of the designated threshold, then at 1018 the battery node is identified for observation. Additional details regarding the treatment of nodes identified as anomalous or identified for observation are discussed throughout the application, and more specifically with respect to FIG. 12.

At 1020, a determination is made as to whether to select an additional battery node for analysis. According to various embodiments, additional battery nodes may continue to be selected until all available battery nodes have been analyzed.

Figure 12:
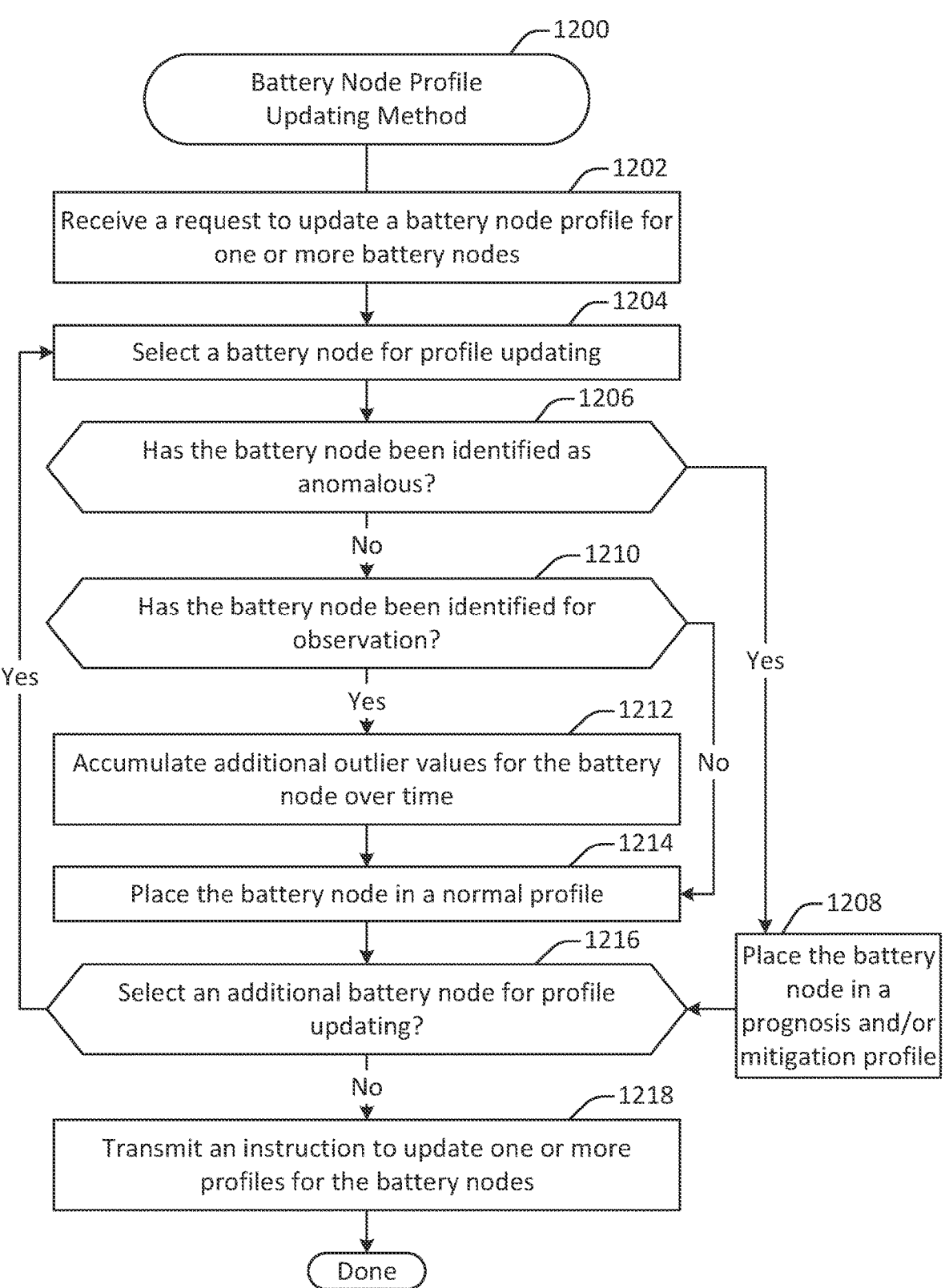
FIG. 12 illustrates a method for updating one or more battery node profiles, performed in accordance with one or more embodiments.

FIG. 12 illustrates a method 1200 for updating one or more battery node profiles, performed in accordance with one or more embodiments. The method 1200 may be performed at one or more elements within a battery ecosystem such as the battery ecosystem 103.

A request to update a battery node profile for one or more battery nodes is received at 1202. In some embodiments, the request may be generated after the performance of the method 1000 shown in FIG. 10.

A battery node is selected for profile updating at 1204. According to various embodiments, battery nodes may be selected for profile updating in parallel or in sequence, and in any suitable order.

A determination is made at 1206 as to whether the battery node has been identified as anomalous. The determination may be made based on the information determined in the method 1000 shown in FIG. 10. If it is determined that the battery node has been identified as anomalous, then the battery node may be placed in a prognosis and/or mitigation profile at 1208. For instance, the battery node may first be placed in a prognosis profile, after which the battery node may be placed in the mitigation profile. Additional information about such profiles are discussed throughout the application, and more particularly with respect to FIG. 5, FIG. 6, and FIG. 7.

If the battery node has not been identified as anomalous, then at 1210 a determination is made as to whether the battery node has been identified for observation. The determination may be made based on the information determined in the method 1000 shown in FIG. 10. If it is determined that the battery node has been identified for observation, then additional outlier values for the battery node may be determined over time at 1212.

In some implementations, accumulating additional outlier values for the battery node over time may involve storing information identifying the battery node. Then, when successive iterations of outlier detection are performed for the battery pack, information about the performance and outlier value for the identified battery node may be stored. In future iterations, the battery node may be identified as anomalous at 1014 not only based on the outlier value associated with the current iteration, but also based on information stored from previous iterations. For instance, the system may look for trends in the data, such as increasing statistical significance in outlier values.

If it is determined that the battery node is anomalous, then the battery node may be placed in a prognosis and/or mitigation profile at 1208. For instance, the battery node may first be placed in a prognosis profile, after which the battery node may be placed in the mitigation profile. Additional information about such profiles are discussed throughout the application, and more particularly with respect to FIG. 5, FIG. 6, and FIG. 7.

The battery node is placed in a normal profile at 1214. A determination is made a at 1216 as to whether to select an additional battery node for profile updating. Additional battery nodes may be selected until all battery nodes have been analyzed. Alternatively, or additionally, battery nodes may be selected for profile updating only when identified as anomalous or identified for observation in the method 1000 shown in FIG. 10.

If it is determined not to select an additional battery node for profile updating, then at 1218 an instruction is transmitted to update one or more profiles for the battery nodes. In some embodiments, transmitting the instruction may involve sending a message from the battery data processing engine 105 to the battery pack 100 identifying updated profile information for one or more battery nodes.

In the foregoing specification, various techniques and mechanisms may have been described in singular form for clarity. However, it should be noted that some embodiments include multiple iterations of a technique or multiple instantiations of a mechanism unless otherwise noted. For example, a system uses a processor in a variety of contexts but can use multiple processors while remaining within the scope of the present disclosure unless otherwise noted. Similarly, various techniques and mechanisms may have been described as including a connection between two entities. However, a connection does not necessarily mean a direct, unimpeded connection, as a variety of other entities (e.g., bridges, controllers, gateways, etc.) may reside between the two entities.

In the foregoing specification, reference was made in detail to specific embodiments including one or more of the best modes contemplated by the inventors. While various implementations have been described herein, it should be understood that they have been presented by way of example only, and not limitation. For example, some techniques and mechanisms are described herein in the context of particular battery pack architectures. However, the techniques of the present invention apply to a wide variety of battery pack architectures. Particular embodiments may be implemented without some or all of the specific details described herein. In other instances, well known process operations have not been described in detail in order not to unnecessarily obscure the present invention. Accordingly, the breadth and scope of the present application should not be limited by any of the implementations described herein, but should be defined only in accordance with the claims and their equivalents.

The invention claimed is:

1. A method comprising:

receiving battery system diagnostic data via a communication interface, the battery system diagnostic data being generated at a plurality of battery node controllers in a battery system, each of the battery node controllers selectively coupling a power bus in the battery system with a respective battery node including a respective one or more battery cells, the battery system diagnostic data including a plurality of battery node diagnostic data portions that each correspond with a respective one of the plurality of battery node controllers;

determining a trained unsupervised machine learning model by applying a machine learning model training procedure to the battery system diagnostic data;

determining a plurality of outlier values by applying the trained unsupervised machine learning model to the plurality of battery node diagnostic data portions;

identifying a designated battery node as being anomalous based on a comparison of a designated outlier value associated with the designated battery node with the plurality of outlier values; and transmitting via a communication interface an instruction to update a battery node operation profile controlling operation of the designated battery node.

2. The method recited in claim 1, wherein the trained unsupervised machine learning model includes a plurality of neurons arranged in a plurality of layers in a neural network, the plurality of neurons including an input layer of neurons corresponding with a battery node diagnostic data portion and an output layer of neurons corresponding with the battery node diagnostic data portion.

3. The method recited in claim 2, wherein the trained unsupervised machine learning model includes a variational autoencoder, the variational autoencoder encoding the input layer of neurons into a latent space layer of neurons, the variational autoencoder decoding the latent space layer of neurons into the output layer of neurons, wherein the plurality of outlier values are reconstruction error values, and wherein the input layer of neurons and the output layer of neurons each have a first number of neurons, and wherein the latent space layer of neurons has a second number of neurons that is less than the first number of neurons.

4. The method recited in claim 1, wherein the trained unsupervised machine learning model includes a clustering model, and wherein the plurality of outlier values measure distance in a multi-dimensional space.

5. The method recited in claim 4, wherein the multi-dimensional space is determined based on the battery system diagnostic data.

6. The method recited in claim 1, wherein the trained unsupervised machine learning model includes a generative adversarial neural network, the generative adversarial neural network including a generative network that maps from a latent space layer of neurons into the output layer of neurons, the generative adversarial neural network including a discriminative network that discriminates between actual battery node observations and novel battery node observations generated by the generative network.

7. The method recited in claim 1, wherein identifying the designated battery node as being anomalous comprises:

determining a mean of the plurality of outlier values; and determining a difference between the mean of the plurality of outlier values and the designated outlier value.

8. The method recited in claim 7, wherein identifying the designated battery node as being anomalous further comprises:

determining a standard deviation of the plurality of outlier values; and determining a designated degree of statistical significance for the difference based at least in part on the mean of the plurality of outlier values and the standard deviation of the plurality of outlier values.

9. The method recited in claim 8, wherein the designated degree of statistical significance for the difference surpasses a designated threshold value.

10. The method recited in claim 1, wherein identifying the designated battery node as being anomalous comprises:

determining a reconstruction anomaly value based at least in part on the designated outlier value, wherein the reconstruction anomaly value surpasses a designated threshold value.

11. The method recited in claim 10, the method further comprising:

identifying a candidate battery node as being potentially anomalous, the candidate battery node being associated with a designated candidate outlier value that does not surpass the designated threshold value but that is within a designated range of the designated threshold value.

12. The method recited in claim 11, the method further comprising:

transmitting an instruction to accumulate a plurality of candidate outlier values for the candidate battery node over time, wherein the candidate battery node is identified as anomalous based on the plurality of candidate outlier values.

13. The method recited in claim 1, wherein the trained unsupervised machine learning model is trained only after the battery system diagnostic data is received.

14. The method recited in claim 1, wherein the battery node operation profile is a diagnostic profile in which the designated battery node is coupled to the power bus, and wherein sensor data for the designated battery node is collected while the designated battery node is provided current in accordance with a predetermined waveform.

15. The method recited in claim 1, wherein the battery node operation profile is a prognosis profile in which the designated battery node is decoupled from the power bus, and wherein sensor data for the designated battery node is collected while the designated battery node is provided current in accordance with a predetermined waveform.

16. The one or more non-transitory computer readable media recited in claim 15, wherein the trained unsupervised machine learning model includes a plurality of neurons arranged in a plurality of layers in a neural network, the plurality of neurons including an input layer of neurons corresponding with a battery node diagnostic data portion and an output layer of neurons corresponding with the battery node diagnostic data portion, and wherein the trained unsupervised machine learning model includes a variational autoencoder, the variational autoencoder encoding the input layer of neurons into a latent space layer of neurons, the variational autoencoder decoding the latent space layer of neurons into the output layer of neurons, wherein the plurality of outlier values are reconstruction error values, and wherein the input layer of neurons and the output layer of neurons each have a first number of neurons, and wherein the latent space layer of neurons has a second number of neurons that is less than the first number of neurons.

17. The one or more non-transitory computer readable media recited in claim 15, wherein the trained unsupervised machine learning model includes a generative adversarial neural network, the generative adversarial neural network including a generative network that maps from a latent space layer of neurons into the output layer of neurons, the generative adversarial neural network including a discriminative network that discriminates between actual battery node observations and novel battery node observations generated by the generative network.

18. The method recited in claim 1, wherein the battery node operation profile is a mitigation profile in which the designated battery node is coupled to the power bus, and wherein one or more restrictions are imposed on charging or discharging the designated battery node.

19. One or more non-transitory computer readable media having instructions stored thereon for performing a method, the method comprising:

receiving battery system diagnostic data via a communication interface, the battery system diagnostic data being generated at a plurality of battery node controllers in a battery system, each of the battery node controllers selectively coupling a power bus in the battery system with a respective battery node including a respective one or more battery cells, the battery system diagnostic data including a plurality of battery node diagnostic data portions that each correspond with a respective one of the plurality of battery node controllers;

determining a trained unsupervised machine learning model by applying a machine learning model training procedure to the battery system diagnostic data;

determining a plurality of outlier values by applying the trained unsupervised machine learning model to the plurality of battery node diagnostic data portions;

identifying a designated battery node as being anomalous based on a comparison of a designated outlier value associated with the designated battery node with the plurality of outlier values; and transmitting via a communication interface an instruction to update a battery node operation profile controlling operation of the designated battery node.

20. A battery system comprising:

a plurality of battery nodes each including a respective one or more battery cells and a respective battery node controller;

a power bus;

a plurality of battery node controllers, each of the battery node controllers selectively coupling the power bus with a respective battery node of the plurality of battery nodes;

a communication interface operable to transmit battery system diagnostic data generated at the plurality of battery node controllers, the battery system diagnostic data including a plurality of battery node diagnostic data portions that each correspond with a respective one of the plurality of battery node controllers; and a battery data processing engine including a processor operable to determine a trained unsupervised machine learning model by applying a machine learning model training procedure to the battery system diagnostic data, the trained unsupervised machine learning model including a plurality of neurons arranged in a plurality of layers in a neural network, the plurality of neurons including an input layer of neurons corresponding with a battery node diagnostic data portion and an output layer of neurons corresponding with the battery node diagnostic data portion, wherein the processor is further configured to determine a plurality of outlier values by applying the trained unsupervised machine learning model to the plurality of battery node diagnostic data portions and to identify a designated battery node as being anomalous based on a comparison of a designated outlier value associated with the designated battery node with the plurality of outlier values, wherein the communication interface is further operable to receive an instruction to update a battery node operation profile controlling operation of the designated battery node.

*     *     *     *     *